(12) United States Patent
Kamioka et al.

(10) Patent No.: US 8,404,537 B2
(45) Date of Patent: *Mar. 26, 2013

(54) METHOD OF MANUFACTURING SEMICONDUCTOR DEVICE

(75) Inventors: Isao Kamioka, Hopewell Junction, NY (US); Junichi Shiozawa, Yokohama (JP); Ryu Kato, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/487,280

(22) Filed: Jun. 4, 2012

(65) Prior Publication Data

US 2012/0282773 A1 Nov. 8, 2012

Related U.S. Application Data

(62) Division of application No. 13/326,499, filed on Dec. 15, 2011, now abandoned, which is a division of application No. 12/926,357, filed on Nov. 12, 2010, now Pat. No. 8,097,503, which is a division of application No. 12/412,962, filed on Mar. 27, 2009, now Pat. No. 7,858,467.

(30) Foreign Application Priority Data

Mar. 28, 2008 (JP) .................................... 2008-85812

(51) Int. Cl.
 *H01L 21/337* (2006.01)
 *H01L 21/8236* (2006.01)
(52) U.S. Cl. . 438/221; 438/196; 438/219; 257/E21.546; 257/E21.642
(58) Field of Classification Search .................. None
See application file for complete search history.

(56) References Cited

U.S. PATENT DOCUMENTS

| 5,183,775 | A | 2/1993 | Levy |
| 7,858,467 | B2 * | 12/2010 | Kamioka et al. ............... 438/221 |
| 8,097,503 | B2 * | 1/2012 | Kamioka et al. ............... 438/221 |
| 2007/0026632 | A1 | 2/2007 | Yamamoto |
| 2011/0017586 | A1 | 1/2011 | Nakamura et al. |

FOREIGN PATENT DOCUMENTS

| JP | 5-226324 | 9/1993 |
| JP | 2002-33381 | 1/2002 |
| JP | 2006-222203 | 8/2006 |
| JP | 2006-286662 | 10/2006 |
| JP | 2009-200483 | 9/2009 |

OTHER PUBLICATIONS

Notification of Reasons for Rejection issued by the Japanese Patent Office on Jul. 27, 2010, for Japanese Patent Application No. 2008-085812, and English-language translation thereof.

* cited by examiner

*Primary Examiner* — Seahvosh Nikmanesh
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming a conductive film whose upper surface and side surface are exposed and an insulation film whose upper surface is exposed, on a semiconductor substrate. The method further includes supplying oxidizing ions or nitriding ions contained in plasma generated by a microwave, a radio-frequency wave, or electron cyclotron resonance to the exposed side surface of the conductive film and the exposed upper surface of the insulation film, by applying a predetermined voltage to the semiconductor substrate, thereby performing anisotropic oxidation or anisotropic nitridation of the exposed side surface of the conductive film and the exposed upper surface of the insulation film.

4 Claims, 29 Drawing Sheets

METHOD OF MANUFACTURING SEMICONDUCTOR DEVICE

CROSS REFERENCE TO RELATED APPLICATION

This is a divisional application of U.S. patent application Ser. No. 13/326,499, filed Dec. 15, 2011 now abandoned, which is a divisional application of U.S. patent application Ser. No. 12/926,357, filed Nov. 12, 2010 (now U.S. Pat. No. 8,097,503 B2, issued Jan. 17, 2012), which is a divisional application of U.S. patent application Ser. No. 12/412,962, filed Mar. 27, 2009 (now U.S. Pat. No. 7,858,467 B2, issued Dec. 28, 2010), which is incorporated herein by reference.

This application is based upon and claims the benefit of priority from the prior Japanese Patent Application No. 2008-85812, filed on Mar. 28, 2008, the entire contents of which are incorporated herein by reference.

BACKGROUND OF THE INVENTION

1. Field of the Invention

The present invention relates to a method of manufacturing a semiconductor device.

2. Background Art

Conventionally, a semiconductor device is manufactured, for example, through the following process. A tunnel insulating film, a polysilicon layer doped with impurities for a floating gate electrode, a stopper film for CMP (Chemical Mechanical Polishing), and a mask film for RIE (Reactive Ion Etching) are sequentially deposited on the surface of a semiconductor substrate, which is doped with desired impurities.

The mask film, the stopper film, the polysilicon layer, and the tunnel insulating film are sequentially etched by RIE. Furthermore, an exposed region of the semiconductor substrate is etched to form an isolation trench.

A silicon oxide film is formed on the exposed surface of the semiconductor substrate by thermal oxidation, and another silicon oxide film is further deposited on the entire surface, to completely bury the silicon oxide film in the isolation trench. The silicon oxide film and the mask film are removed by CMP to planarize the surface, to make the surface of the stopper film be exposed.

After selectively removing the stopper film by etching, the exposed surface of the silicon oxide film is etched using a diluted hydrofluoric acid solution, to make the sidewall surfaces of the polysilicon layer be exposed.

After an inter electrode insulating film with a three-layer structure including a silicon oxide film, a silicon nitride film, and a silicon oxide film is deposited on the entire surface, a conductive layer with a two-layer structure including a polysilicon layer and a tungsten silicide layer is deposited, and a mask film for RIE is then deposited. The conductive layer is to be etched to form a control gate electrode. In this specification, layers in each multi-layer structure are described in order from the lowest layer to the highest layer.

The mask film, the conductive layer, the inter electrode insulating film, and the polysilicon layer are sequentially etched by RIE, to form a slit part between stacked cells, the slit part extending in a direction perpendicular to the isolation trench. Thereby, the shapes of the floating gate electrode and the control gate electrode are determined.

After forming a silicon oxide film on the exposed surface by thermal oxidation as an electrode sidewall oxide film, a cell diffusion layer is formed, and a silicon oxide film is then formed as an inter layer dielectric so as to cover the entire surface. Subsequently, an interconnect layer and the like are formed to complete nonvolatile memory cells. However, this manufacturing method has the following problems.

(a) As nonvolatile memory cells become finer, the reliability of the memory cells will be significantly lowered due to the cell width (channel width) in the word-line direction (channel-width direction) becoming smaller. Accordingly, if oxidation performed for mending RIE process damage before filling the isolation trenches with the silicon oxide film is performed by isotropic oxidation such as thermal oxidation, the cell width becomes excessively small, lowering the reliability of the memory cells. Concurrently, the dopant concentration is lowered due to the dopant in the channel regions being drawn into the oxide film as a result of thermal oxidation of the sidewalls of the semiconductor substrate, causing erroneous writing in the memory cells.

Also, where the memory cells become finer, resulting in a decrease in the isolation trench width, if the isolation trenches are substantially completely filled with an insulating film, parasitic capacitances between adjacent elements cannot be ignored because they may cause erroneous memory operation, which is what is called "inter-cell interference". Accordingly, it is necessary to provide cavities in the isolation trenches. However, in case that an insulating film is provided into the isolation trenches by means of deposition, it is difficult to form cavities having the same shape because of difficulty in depositing the insulating film on the sidewall parts of the isolation trenches.

(b) In nonvolatile memory cells, when a polysilicon layer is processed by RIE to form floating gate electrodes, the lower end parts of the floating gate electrodes are formed in a pointed shape, locally generating a high electric field during writing/erasing operation for the memory cells, resulting in lowering the reliability of the memory cells. Therefore, the locally-generated high electric field is reduced by forming a silicon oxide film, which is an electrode sidewall oxide film, by thermal oxidation to increase the distance between the lower end part of each floating gate electrode and the semiconductor substrate surface and also increase the curvature of the lower end parts of the floating gate electrodes. However, as the memory cells become finer, the oxidation amount in the sidewall parts of the floating gate electrodes, which are formed by thermal oxidation, cannot be ignored and the cell width (channel length) in the bit-line direction (channel-length direction) becomes excessively small, making the control of the memory cell characteristics difficult, causing erroneous memory operation.

Furthermore, as the memory cells become finer, when a polysilicon layer is processed by RIE to form floating gate electrodes, there is a tendency that the width of the floating gate electrodes becomes wider toward their lower parts (i.e., has what is called a skirt shape). Accordingly, the lower end parts of the floating gate electrodes are formed in a sharply pointed shape, which is a factor promoting the lowering of the cell reliability.

(c) Transistor elements also have a problem similar to problem (b), which is a factor of lowering the transistor reliability.

(d) In nonvolatile memory cells, when the control gate electrodes are formed by a metal, a metal silicide or a metal nitride such as tungsten silicide, nickel silicide, cobalt silicide, tungsten, tantalum, titanium, tungsten nitride, tantalum nitride or titanium nitride, the following problems are caused. A mask film, a conductive layer, an inter electrode insulating film and a polysilicon layer are sequentially processed by RIE to form slit parts between the stacked cells, thereby determining the shapes of the floating gate electrodes and the control gate electrodes. When a silicon oxide film, which is called an electrode sidewall oxide film, is formed on the exposed surface by thermal oxidation, oxidation of the metal, the metal silicide or the metal nitride are accelerated, causing a problem in a decrease in conductivity of the control gate electrodes. Also, expansion caused by oxidation has adverse effects on the subsequent diffusion layer formation process by ion implantation.

(e) Also, transistor elements using a metal, a metal silicide or a metal nitride for gate electrodes have a problem similar to that of the nonvolatile memory cells described in (d) above.

(f) In nonvolatile memory cells, where the inter electrode insulating film is formed of a high-permittivity metal oxide film containing oxygen, such as alumina, hafnia, zirconia, aluminum silicate, hafnium silicate or zirconium silicate instead of the three-layer structure consisting of a silicon oxide film, a silicon nitride film and a silicon oxide film, the following problem is caused. When, in the process of forming a silicon oxide film, which is called an electrode sidewall oxide film, on the exposed surface by thermal oxidation after sequentially processing the mask film, the conductive layer, the inter electrode insulating film and the polysilicon layer by RIE to form slit parts between the stacked cells, thereby determining the shapes of the floating gate electrodes and the control gate electrodes, the thermal oxidation is performed in an atmosphere including a reducing gas such as a hydrogen gas, a reaction to abstract oxygen from the inter electrode insulating film occurs, causing deterioration in the insulation property of the inter electrode insulating film.

(g) In some nonvolatile memories, peripheral transistors are formed on a planar part of a semiconductor substrate and memory cells are formed on a partial SOI (Silicon on Insulator) substrate of the same semiconductor substrate. In such a case, a step part is formed at the boundary between the planar part and the partial SOI substrate by etching. Conventionally, both the planar part and a sidewall providing the step part are then oxidized by thermal oxidation.

Subsequently, even though the sidewall oxide film is removed by etching, the position of the step part is displaced as a result of oxidation and etching. This position corresponds to the boundary between the peripheral transistors and the memory cells, and is used as a reference for pattern formation. Consequently, displacement of this position causes pattern displacement.

A conventional nonvolatile memory cell manufacturing method is disclosed in, for example, JP-A 2006-222203 (KOKAI).

SUMMARY OF THE INVENTION

An aspect of the present invention is, for example, a method of manufacturing a semiconductor device, the method including forming, on a surface of a semiconductor substrate, an isolation trench including sidewall parts and a bottom part, or a stepped structure including a first planar part, a second planar part, and a step part located at a boundary between the first planar part and the second planar part, and supplying oxidizing ions or nitriding ions contained in plasma generated by a microwave, a radio-frequency wave, or electron cyclotron resonance to the sidewall parts and the bottom part of the isolation trench or the first and second planar parts and the step part of the stepped structure by applying a predetermined voltage to the semiconductor substrate, to perform anisotropic oxidation or anisotropic nitridation of the sidewall parts and the bottom part of the isolation trench or the first and second planar parts and the step part of the stepped structure.

Another aspect of the present invention is, for example, a method of manufacturing a semiconductor device, the method including forming a gate insulation film on a semiconductor substrate, forming a conductive film as a material for a gate electrode, on the gate insulation film, etching the conductive film to form the gate electrode including sidewall parts, and make a part of a surface of the gate insulation film be exposed, and supplying oxidizing ions or nitriding ions contained in plasma generated by a microwave, a radio-frequency wave, or electron cyclotron resonance to the sidewall parts of the gate electrode and a region where the gate insulation film is exposed, by applying a predetermined voltage to the semiconductor substrate, to perform anisotropic oxidation or anisotropic nitridation of the sidewall parts of the gate electrode and the region where the gate insulation film is exposed.

Another aspect of the present invention is, for example, a method of manufacturing a semiconductor device, the method including forming a first film to be processed, on a semiconductor substrate, forming a second film to be processed, on the first film, removing a predetermined region of the second film by etching, to form a slit part including sidewall parts and a bottom part, the sidewall parts including side surfaces of the second film, and the bottom part including an upper surface of the first film, and supplying oxidizing ions or nitriding ions contained in plasma generated by a microwave, a radio-frequency wave, or electron cyclotron resonance to the sidewall parts and the bottom part of the slit part by applying a predetermined voltage to the semiconductor substrate, to perform anisotropic oxidation or anisotropic nitridation of the sidewall parts and the bottom part of the slit part.

DESCRIPTION OF THE EMBODIMENTS

Embodiments of a method of manufacturing a semiconductor device according to the present invention will be described with reference to the drawings.

Figure 1:
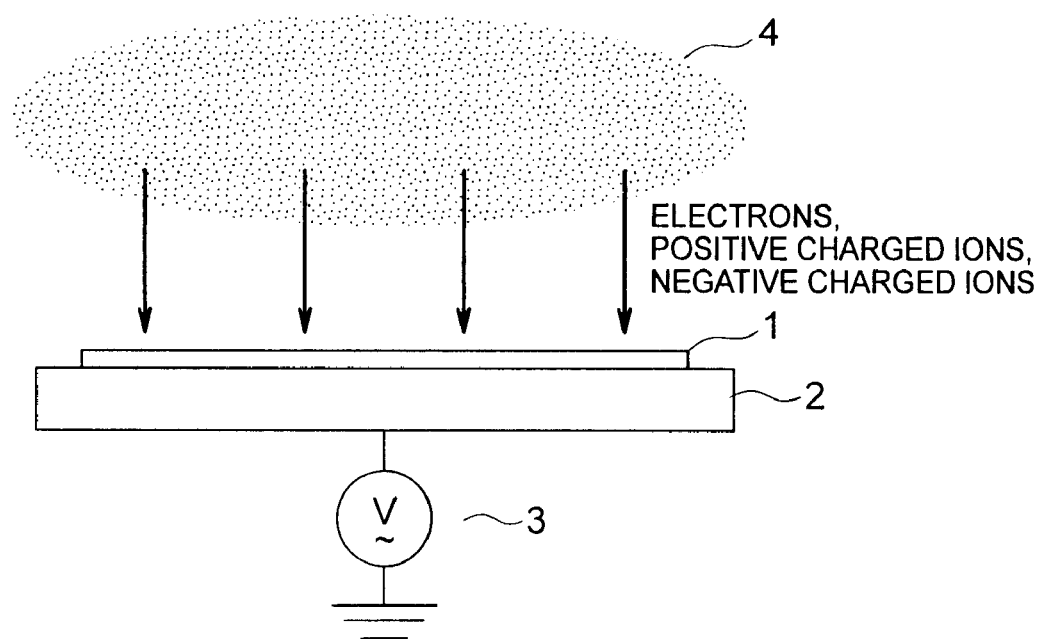
FIG. 1 is an explanatory diagram showing an arrangement of a manufacturing equipment in performing anisotropic oxidation or anisotropic nitridation, which is to be used in manufacturing a semiconductor device according to first to ninth embodiments.

In the embodiments described below, a semiconductor device is manufactured using anisotropic oxidation or anisotropic nitridation. As illustrated in FIG. 1, a semiconductor substrate 1 is mounted on a stage 2. A predetermined radio-frequency voltage V is applied from a power supply 3 to the stage 2, thereby the radio-frequency voltage being applied to the semiconductor substrate 1.

When plasma 4 is generated by at least any one of microwaves, radio-frequency waves and electron cyclotron resonance after introducing an oxygen-containing gas above the semiconductor substrate 1 in this state, oxidizing ions, oxidizing neutral radicals, electrons, etc., are generated. Here, the oxidizing ions include, e.g., positively- or negatively-charged oxygen molecules ($O_2$), oxygen atoms (O) and ozone ($O_3$). Alternatively, where a nitrogen-containing gas is introduced together with the oxygen-containing gas, the oxidizing ions also include, e.g., positively- or negatively-charged nitrogen monoxide molecules (NO) and nitrous oxide molecules ($N_2O$). Then, by properly selecting the absolute value of the radio-frequency voltage V applied to the semiconductor substrate 1, these oxidizing ions contained in the plasma 4 are accelerated toward the semiconductor substrate 1, and substantially perpendicularly enter the surface of the semiconductor substrate 1.

Here, a large amount of oxidizing ions is supplied to the parts parallel to the surface of the semiconductor substrate 1, and a relatively small amount of oxidizing ions is supplied to the area perpendicular to the surface of the semiconductor substrate 1. Consequently, anisotropic oxidation in which the parts parallel to the surface of the semiconductor substrate 1 has a large amount of oxidation and the parts perpendicular to the surface of the semiconductor substrate 1 has a relatively small amount of oxidation can be provided.

Similarly, plasma 4 is generated by at least any one of microwaves, radio-frequency waves and electron cyclotron resonance after introducing a nitrogen-containing gas above the semiconductor substrate 1, nitriding ions, nitriding neutral radicals, electrons, etc., are generated. Here, the nitriding ions include, e.g., positively- or negatively-charged nitrogen molecules ($N_2$) and nitrogen atoms (N). Alternatively, where an oxygen-containing gas is introduced together with the nitrogen-containing gas, the nitriding ions also include, e.g., positively- or negatively-charged nitrogen monoxide molecules (NO) and nitrous oxide molecules ($N_2O$). Then, by properly selecting the absolute value of the radio-frequency voltage V applied to the semiconductor substrate 1, these nitriding ions contained in the plasma 4 are accelerated toward the semiconductor substrate 1 and substantially perpendicularly enter the surface of the semiconductor substrate 1.

Here, a large amount of nitriding ions is supplied to the parts parallel to the surface of the semiconductor substrate 1, and a relatively small amount of nitriding ions is supplied to the parts perpendicular to the semiconductor substrate 1. Consequently, anisotropic nitridation in which the parts parallel to the surface of the semiconductor substrate 1 has a large amount of nitridation and the parts perpendicular to the surface of the semiconductor substrate 1 has a relatively small amount of nitridation can be provided.

In the above-described anisotropic oxidation or anisotropic nitridation, it is desirable that the pressure in the region in which the plasma 4 is generated should be, for example, 2 kPa or less. A lower pressure, which provides a higher ratio of generation of oxidizing ions or nitriding ions, is desirable because more conspicuous anisotropic oxidation or anisotropic nitridation can be provided. Furthermore, it is desirable that the pressure of the supply path of oxidizing ions or nitriding ions should be lowered to, for example, 2 kPa or less because the mean free path of the oxidizing ions or nitriding ions is lengthened, and accordingly, even where deep trenches are formed in the semiconductor substrate 1, a sufficient amount of oxidizing ions or nitriding ions can be supplied to the bottom parts of the trenches. Also, the temperature of the semiconductor substrate 1 can be set within the range of, for example, room temperature to around 800° C. Here, it is desirable that the temperature of the semiconductor substrate 1 should be, for example, 300° C. or more because it enhances the insulation property of the oxide film or nitride film to be formed and enables reduction of formation time.

(1) First Embodiment

A method of manufacturing a semiconductor device according to a first embodiment of the present invention will be described. The first embodiment corresponds to an example of applying the present invention to a nonvolatile memory.

Figure 2:
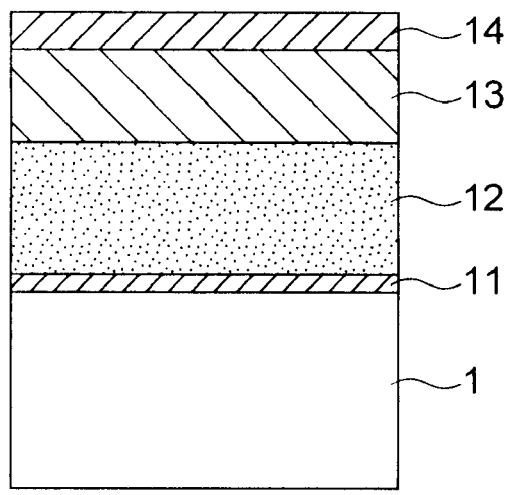
FIGS. 2 to 9 are longitudinal cross sectional views showing a method of manufacturing a semiconductor device according to a first embodiment.

First, as illustrated in FIG. 2, after forming a tunnel insulating film 11 with a thickness of 10 nm on the surface of a silicon substrate 1 doped with a desired impurity, by thermal oxidation, a polysilicon layer 12 with a thickness of 150 nm, the polysilicon layer 12 being doped with phosphorus and becoming floating gate electrodes, a stopper film 13 used for CMP (Chemical Mechanical Polishing), and a mask film 14 used for performing RIE (Reactive Ion Etching) are sequentially deposited by reduced-pressure CVD (Chemical Vapor Deposition).

Figure 3:
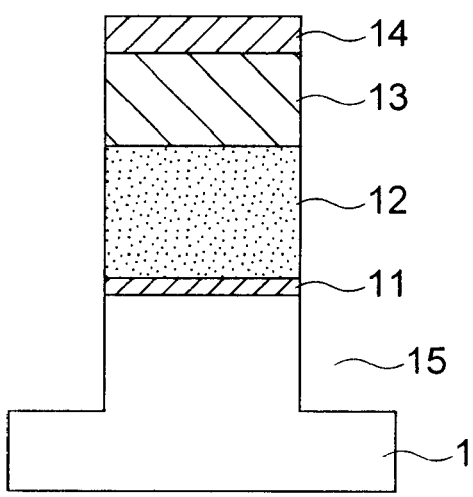

Next, RIE using a resist mask (not shown), the mask film 14, the stopper film 13, the polysilicon layer 12 and the tunnel insulating film 11 are sequentially etched. Furthermore, exposed regions of the semiconductor substrate 1 are etched, and as illustrated in FIG. 3, isolation trenches 15 (only one of which is shown) with a depth of 150 nm, each isolation trench 15 having sidewall parts and a bottom part are formed.

Figure 4:
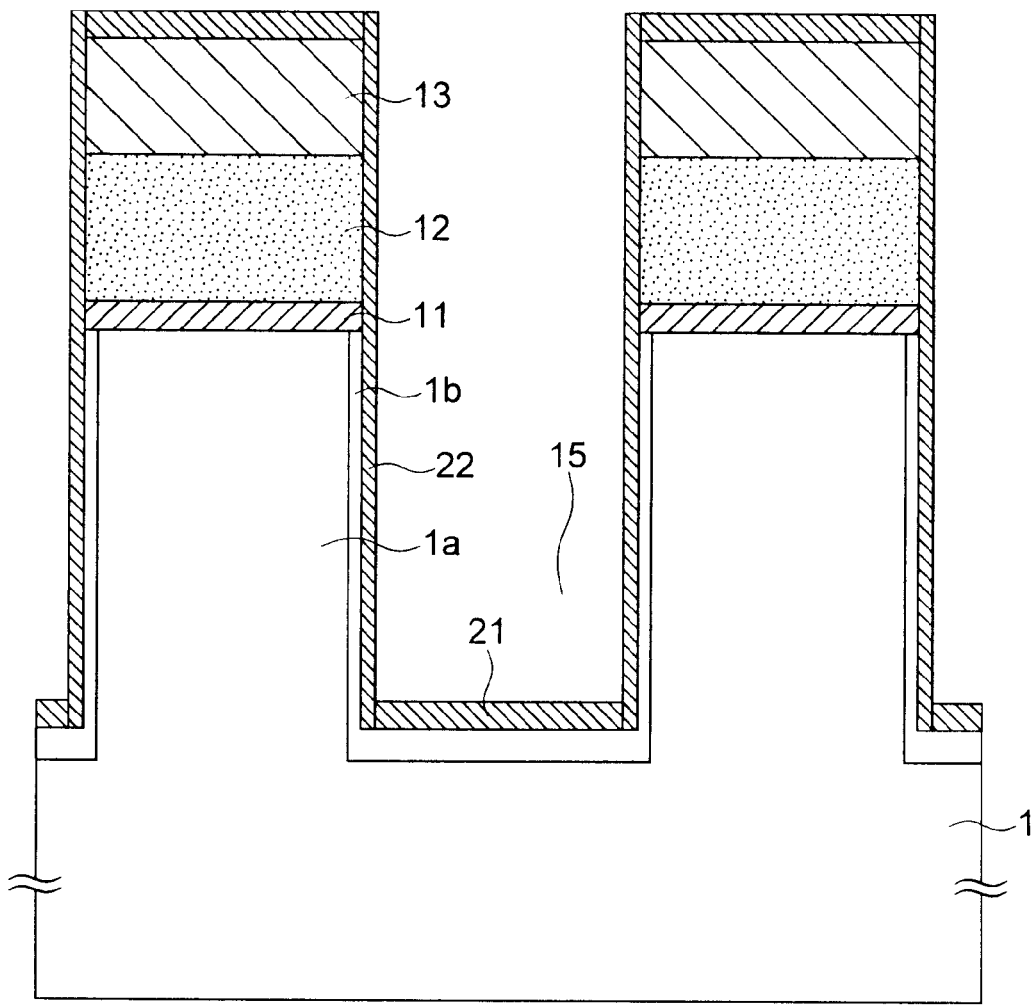

Next, as illustrated in FIG. 4, a silicon oxide film is formed on the part of the semiconductor substrate 1 whose surface is exposed in the isolation trench 15, by means of the aforementioned anisotropic oxidation. By means of microwaves, radio-frequency waves or electron cyclotron resonance, oxidizing neutral radicals, oxidizing ions and electrons are generated, and a radio-frequency voltage of, for example, 10 to 100 V is applied to the semiconductor substrate 1 to make the oxidizing ions be accelerated toward the surface of the semiconductor substrate 1 and substantially perpendicularly enter the surface of the semiconductor substrate 1.

Consequently, the bottom part of the isolation trench 15 is selectively oxidized, forming a relatively thick silicon oxide film 21. Meanwhile, oxidation of sidewall parts 1a of the isolation trench 15 and the sidewall parts of the floating gate electrodes 12 is suppressed, forming a relatively thin silicon oxide film 22. Here, the silicon oxide film 21 has an average thickness of around 5 nm, and the silicon oxide film 22 has an average thickness of around 3 nm. Here, although the silicon oxide film 22 is formed also on the sidewall parts of the tunnel insulating film 11, the sidewall parts of the stopper film 13 and the upper surface part of the stopper film 13 in FIG. 4, it may not be formed on them depending on their materials.

In the step shown in FIG. 2, the deposition of the stopper film 13 may be omitted. In this case, in the step shown in FIG. 3, the polysilicon layer 12 can be used as a stopper. The omission of the deposition of the stopper film 13 makes the etching process by RIE to be performed easier.

In conventionally-used thermal oxidation, which will be described later, the silicon oxide film on the sidewall parts and the silicon oxide film on the bottom part of the isolation trenches are formed to have the substantially same thickness. More specifically, the thermal oxidation rate varies depending on the crystal plane orientation of the silicon substrate, and accordingly, when an ordinary (100) substrate is used, the thickness of the sidewall parts becomes larger by about 10 to 20%. Meanwhile, the anisotropic oxidation according to the first embodiment enables the thickness of the silicon oxide film 22 on the sidewall parts to be reduced to be around half the film thickness on the bottom part. Accordingly, process damage in the bottom parts of the isolation trenches 15 due to RIE can be removed with almost no reduction of the width (channel length) of the semiconductor substrate 1 between the isolation trenches 15. Consequently, punch-through can be effectively suppressed without deterioration of the reliability of the memory cells.

In other words, when process damage remains, a current flows by the influence of the surface potential, resulting in punch-through easily occurring. However, punch-through can be suppressed by forming the silicon oxide film 22 to be thick on the bottom parts to remove the process damage.

Also, in a nonvolatile memory, suppression of oxidation of the sidewall parts 1a of the semiconductor substrate 1 enables suppression of a decrease in the dopant concentration at the channel edges and suppression of fluctuation in a boost ratio 13, and consequently, erroneous memory operation can effectively be avoided. More specifically, as a result of reducing the thickness of the silicon oxide film 22 formed on the sidewall parts 1a, the width of channel edge regions 1b whose dopant concentration has been lowered due to the dopant (such as boron) being drawn into the silicon oxide film 22.

Here, the boost ratio β is approximately expressed as follows.

$$\beta = Cins/(Cins+Cch)$$

provided that Cins=Cipd*Ctnl/(Cipd+Ctnl), wherein Cipd is the capacitance of the inter electrode insulating film, Ctnl is the capacitance of the tunnel insulating film, Cins is the series capacitance of Cipd and Ctnl, and Cch is the capacitance of the channel.

Furthermore, when the anisotropic oxidation according to the first embodiment is performed under the substrate temperature of 300° C. or higher, the silicon oxide films 21 and 22 exhibit good insulation property similar to or better than that of a conventional thermal oxide film, thereby a good breakdown resistance of the isolation and a good reliability of the memory cells are achieved.

Figure 5:
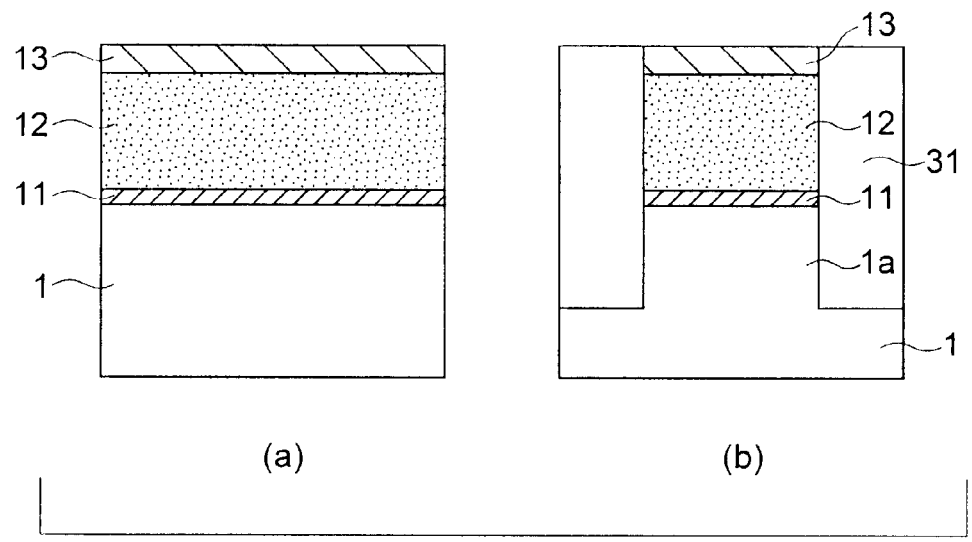

Subsequently, as in ordinary manufacturing methods, as illustrated in FIGS. 5(a) and 5(b), a silicon oxide film 31 with a thickness of 400 nm, which is an insulating film for isolation, is deposited on the entire surface by plasma CVD to completely fill the isolation trench 15. Here, FIGS. 5(a), 6(a), 7(a) and 8(a) correspond to cross-sectional views in the bit-line (channel-length) direction, and FIGS. 5(b), 6(b), 7(b) and 8(b) correspond to cross-sectional views in the word-line (channel-width) direction. Also, in FIGS. 5(a) and 5(b) to 8(a) and 8(b), an illustration of the silicon oxide films 21 and 22 and the channel edge regions 1b in FIG. 4 is omitted.

The silicon oxide film 31 and the mask film 14 at the surface part are removed by CMP to planarize the surface. Here, the surface of the stopper film 13 is exposed.

Next, as illustrated in FIGS. 6(a) and 6(b), after selectively removing the exposed stopper film 13 by etching, the exposed surface of the silicon oxide film 31 are removed by etching using a diluted hydrofluoric acid solution to make the sidewall parts of the polysilicon layer 12 be exposed. It is assumed that the height of the exposed sidewall parts is 70 nm.

Next, as illustrated in FIGS. 7(a) and 7(b), an inter electrode insulating film 32 with a thickness of 15 nm, the inter electrode insulating film 32 having a three-layer structure consisting of a silicon oxide film, a silicon nitride film and a silicon oxide film is formed on the entire surface by sequentially depositing these films by reduced-pressure CVD. Furthermore, a conductive layer 33 with a thickness of 100 nm, the conductive layer 33 having a two-layer structure consisting of a polysilicon layer and a tungsten silicide layer and becoming control gate electrodes, is formed by sequentially depositing the polysilicon layer and the tungsten silicide layer by reduced-pressure CVD. A mask film 34 for RIE is further deposited by reduced-pressure CVD.

Next, by means of RIE using a resist mask (not shown), the mask film 34, the conductive layer 33, the inter electrode insulating film 32 and the polysilicon layer 12 are sequentially etched to form slit parts 38 between the stacked cells. Consequently, the shapes of the floating gate electrodes 12 and the control gate electrodes 33 are determined. The tunnel insulating film 11 is an example of a first film to be processed in the present invention, and a film including the polysilicon layer 12, the inter electrode insulating film 32, and the conductive layer 33 is an example of a second film to be processed in the present invention.

Next, as illustrated in FIGS. 8(a) and 8(b), a silicon oxide film 35 with a thickness of 10 nm, which is called an electrode sidewall oxide film, is formed on the exposed surface using the aforementioned anisotropic oxidation, and then a cell diffusion layer 39 is formed using ion implantation. Furthermore, a silicon oxide film 36 and a silicon oxide 37, which serve as an inter layer dielectric, are formed by reduced-pressure CVD so as to cover the entire surface. An interconnect layer (not shown) and the like are formed through the subsequent process to complete nonvolatile memory cells.

Figure 8:
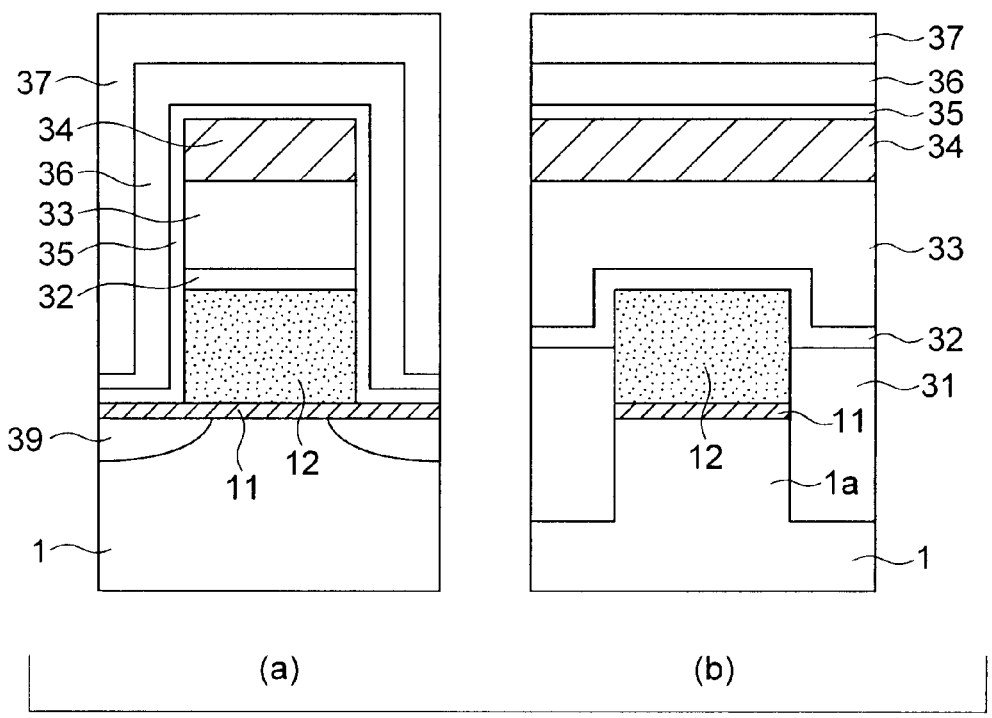
Figure 9:
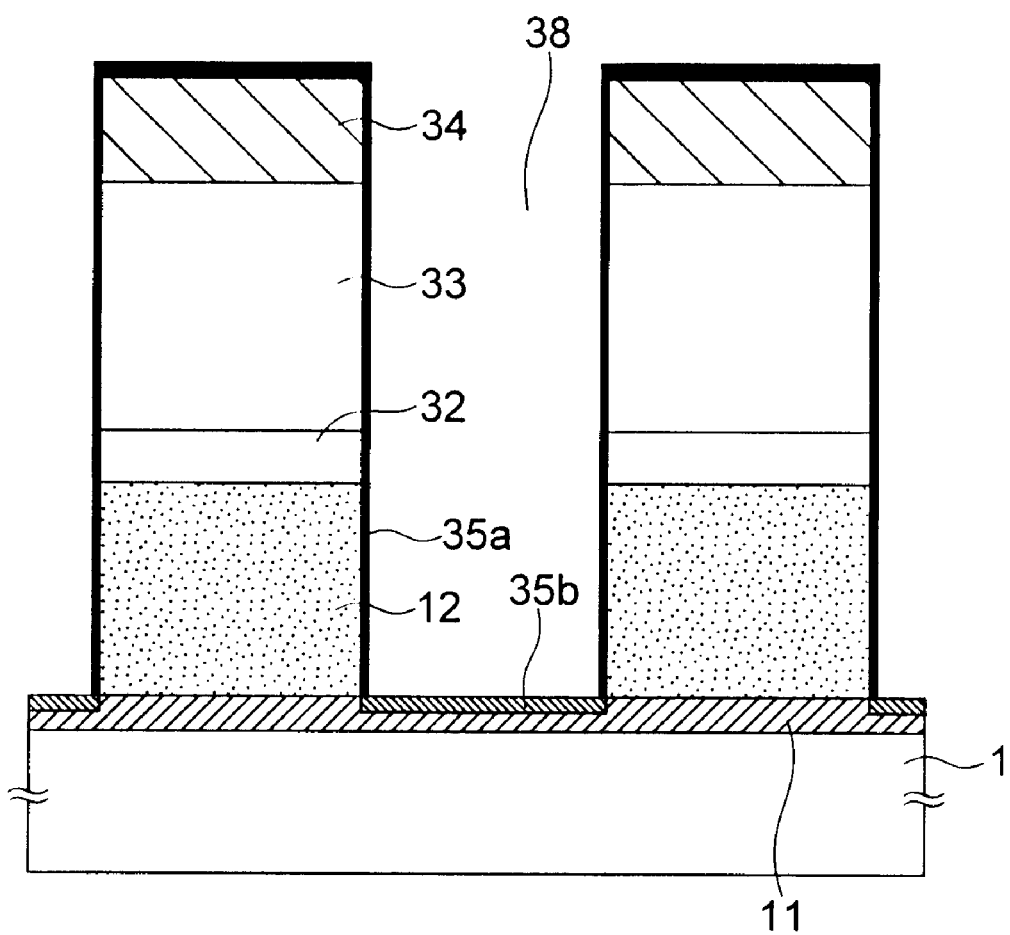

Here, FIG. 9 is a more detailed illustration of the structure at the stage of the silicon oxide film 35 having been formed by anisotropic oxidation in the cross-section illustrated in FIG. 8(a). Oxidation of the sidewall parts of the floating gate electrode 12 and the control gate electrode 33 is suppressed to make the silicon oxide film 35a on those parts be thin, and the upper region 35b of the tunnel insulating film 11 exposed on the bottom region in the slit parts 38 is selectively oxidized to effectively improve the quality of the tunnel insulating film 11 near the lower end of the floating gate electrode 12, the tunnel insulating film having RIE damage. Consequently, the reliability of the memory cells can be improved while suppressing a decrease in cell width (channel length) in the bit-line direction (channel length direction). Here, although FIG. 9 illustrates the case where the upper region of the tunnel insulating film 11 is selectively oxidized, regions to be selectively oxidized can be also extended to the surface parts of the silicon substrate 1 of the slit parts, by performing the anisotropic oxidation longer or at higher temperature, or changing the material of the tunnel insulating film to such a material that is easily oxidized. In this case, the distance between the lower end parts of the floating gate electrodes 12 and the surface of the silicon substrate 1 can be increased, and accordingly, the electric field is reduced, enabling further enhancement of the reliability of the memory cells. Although in FIG. 9, the silicon oxide film 35a is formed also on the sidewall parts of the inter electrode insulating film 32, the sidewall parts of the mask film 34 and the upper surface part of the mask film 34, it may not be formed on them depending on their materials.

(2) Comparative Example 1 for the First Embodiment

Figure 10:
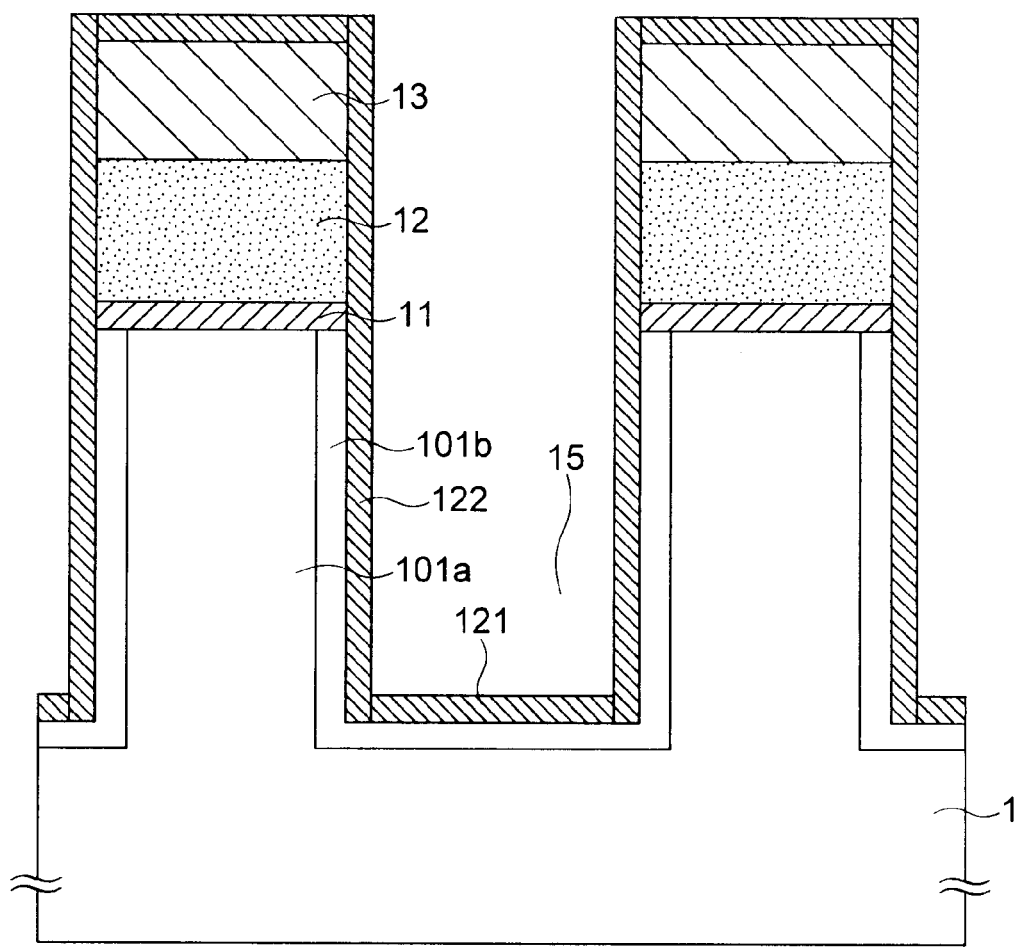
FIGS. 10 and 11 are longitudinal cross sectional views showing a method of manufacturing a semiconductor device according to comparative example 1 for the first embodiment.

In a method of manufacturing a semiconductor device according to comparative example 1, silicon oxide films are formed by isotropic thermal oxidation, which is different from the first embodiment. Accordingly, as illustrated in FIG. 10, which corresponds to FIG. 4 in the first embodiment, the thickness of a silicon oxide film 122 formed on the sidewalls of a semiconductor substrate 101a is made to be as thick as that of the silicon oxide film 121 formed at the bottom parts of isolation trenches 15, making the cell width (channel width) be small. Here, although in FIG. 10, the silicon oxide film 122 is formed also on the sidewall parts of a tunnel insulating film 11, the sidewall parts of a stopper film 13 and the upper parts of the stopper film 13, it may not be formed on them depending on their materials.

Furthermore, during forming the silicon oxide film 122, a large amount of dopant in the semiconductor substrate 101a is drawn out, and as a result, the width of the channel edges 101b having a decreased concentration is widened, and the decrease in dopant concentration in the channel regions causes erroneous writing in the cells.

Figure 11:
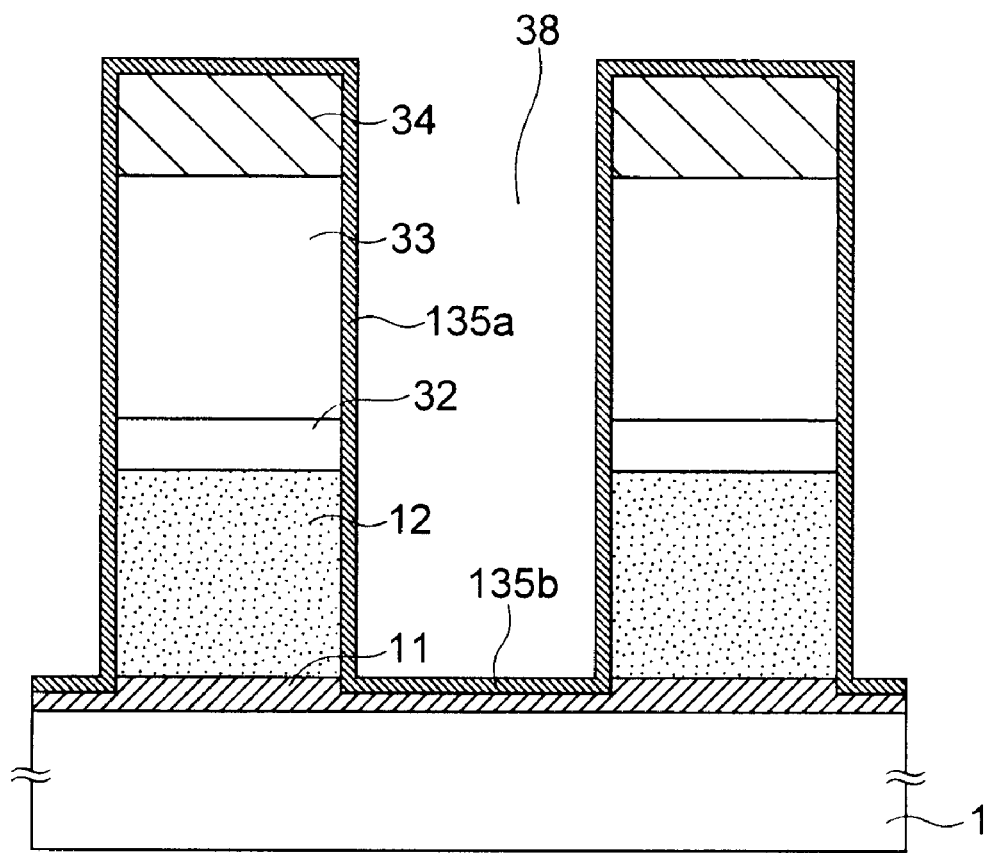

Furthermore, in comparative example 1, in the process illustrated in FIG. 11, which corresponds to FIG. 9 in the first embodiment, a silicon oxide film is formed by isotropic thermal oxidation. Accordingly, the thickness of the silicon oxide film 135a on the sidewalls of the floating gate electrodes 12, the inter electrode insulating film 32a and the control gate electrodes 33 are made to be as thick as that of the silicon oxide film 135b on the bottom surface of the slit parts 38, making the cell width (channel length) be small. Here, although in FIG. 11, the upper layer parts of the tunnel insulating film 11 are oxidized, the oxidation may extend to the surface parts of the silicon substrate 1 at the slit part regions depending on the material of the tunnel insulating film. Also, the silicon oxide film 35a is formed also on the sidewall parts of the inter electrode insulating film 32, the sidewall parts of the mask film 34 and the upper parts of the mask film 34, it may not be formed on them depending on their materials.

(3) Modification 1 for the First Embodiment

A method of manufacturing a semiconductor device according to modification 1 for the first embodiment will be described. Modification 1 corresponds to an example of applying the present invention to a nonvolatile memory.

Figure 12:
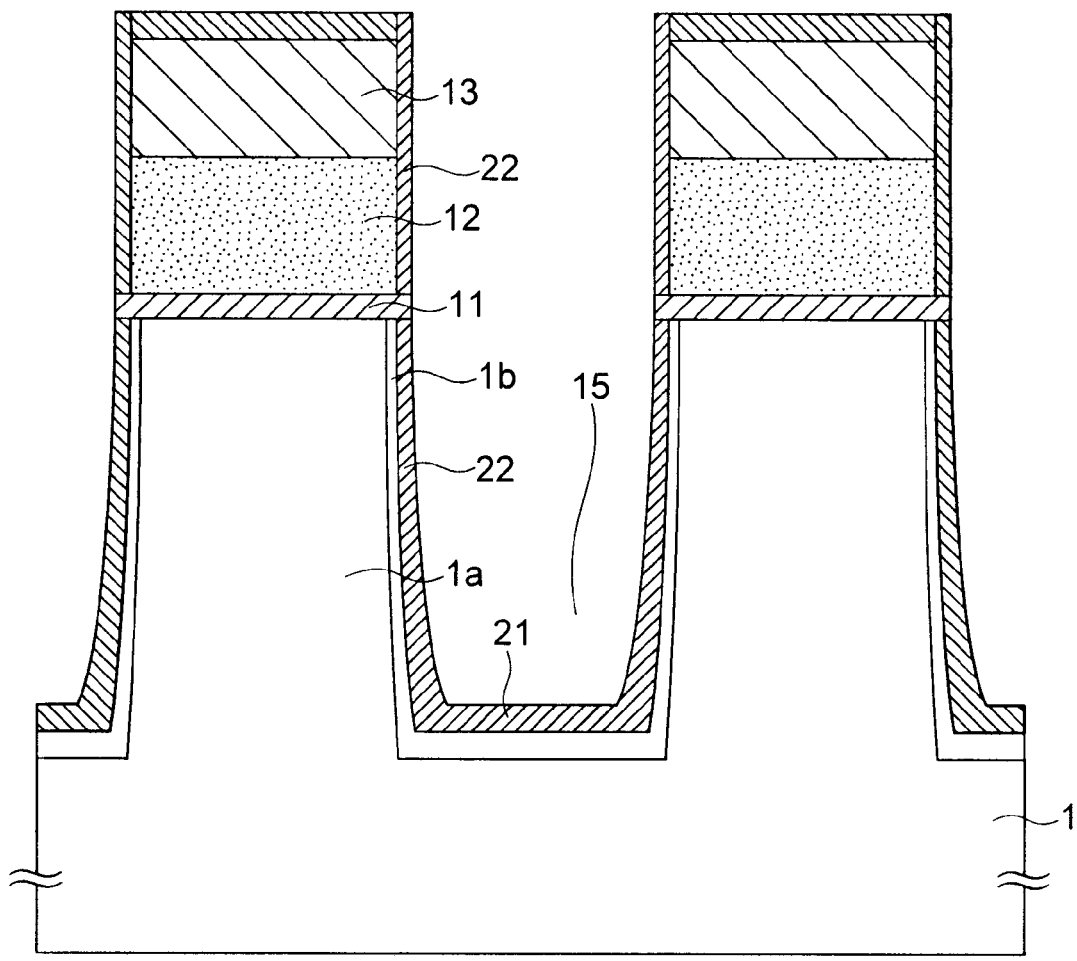
FIGS. 12 and 13 are longitudinal cross sectional views showing a method of manufacturing a semiconductor device according to modification 1 for the first embodiment.

As illustrated in FIG. 12, through the process steps illustrated in FIGS. 2 and 3 in the first embodiment, a tunnel insulating film 11 with a thickness of 10 nm, a polysilicon layer 12 with a thickness of 150 nm, the polysilicon layer 12 being doped with phosphorus, a stopper film 13 and a mask film 14 are sequentially deposited by means of reduced-pressure CVD on the surface of a semiconductor substrate 1 doped with a desired impurity. Next, the mask film 14, the stopper film 13, the polysilicon layer 12 and the tunnel insulating film 11 are sequentially etched, and furthermore, the exposed regions of the semiconductor substrate 1 are processed by RIE to form isolation trenches 15 (only one of which is shown) with a depth of 150 nm, each having sidewall parts and a bottom part. Here, the RIE-process conditions are adjusted so that the width of the isolation trench 15 is decreased toward the bottom part (i.e., so that the part 1a of the semiconductor substrate 1 protruding between the isolation trenches 15 has a skirt shape in cross-section). Consequently, the isolation trench 15 can easily be filled with an insulating film for isolation.

Next, as in the first embodiment, oxidizing ions are generated by microwaves, radio-frequency waves or electron cyclotron resonance and a radio-frequency voltage of, for example, 10 to 100 V is applied to the semiconductor substrate 1.

Consequently, the oxidizing ions substantially perpendicularly enter the semiconductor substrate 1. As a result, the bottom part of the isolation trench 15 is selectively oxidized, forming a relatively thick silicon oxide film 21. Meanwhile, oxidation of the upper part region of sidewall parts 1a of the isolation trench 15 and the sidewall parts of the floating gate electrode 12 is suppressed, forming a relatively thin silicon oxide film 22. The thickness of the silicon oxide film 22 from the upper part region to the lower part region of the sidewall parts 1a of the isolation trench 15 gradually increases according to the degree of the shirt shape. Here, although in FIG. 12, the thin silicon oxide film 22 is not formed on the sidewall parts of the tunnel insulating film 11, it may be formed on them depending on the material. Also, although the silicon oxide film 22 is formed also on the sidewall parts of the stopper film 13 and the upper surface parts of the stopper film 13, it may not be formed on them depending on the material.

As described above, as a result of forming the silicon oxide films 21 and 22 using anisotropic oxidation, RIE-process damage at the bottom parts of the isolation trenches 15 can be removed with almost no decrease in the width (channel width) of the upper part regions of the semiconductor substrate 1 between the isolation trenches 15 as in the first embodiment. Consequently, punch-through can be suppressed without deterioration of the cell reliability. Furthermore, an increase in the distance between the lower part regions of adjacent protruding parts 1a of the semiconductor substrate provides a punch-through suppression effect.

Also, in a nonvolatile memory, as a result of suppressing oxidation of the sidewall parts of the protruding parts 1a, drawing-out of the dopant from the channel edges 1b is suppressed, enabling suppression of fluctuation in the boost ratio.

Furthermore, when the anisotropic oxidation according to the first embodiment is performed under the substrate temperature of 300° C. or higher, the silicon oxide films 21 and 22 exhibit good insulation property similar to or better than that of a conventional thermal oxide film, thereby a good breakdown resistance of the isolation and a good reliability of the memory cells are achieved.

Subsequently, as in the first embodiment, a silicon oxide film 31, which is an insulating film for isolation, is deposited by plasma CVD to completely fill the isolation trench 15 as illustrated in FIGS. 5(*a*) and 5(*b*). The silicon oxide film 31 and the mask film 14 at the surface part are removed by CMP to planarize the surface. Consequently, the surface of the stopper film 13 is exposed. In the cross-sections illustrated in FIGS. 5(*a*) and 5(*b*) to 8(*a*) and 8(*b*), the protruding part 1*a* of the semiconductor substrate does not have a skirt shape in cross section. However, in modification 1, it is assumed that the protruding part 1*a* has a skirt shape in cross section as described above.

Figure 6:
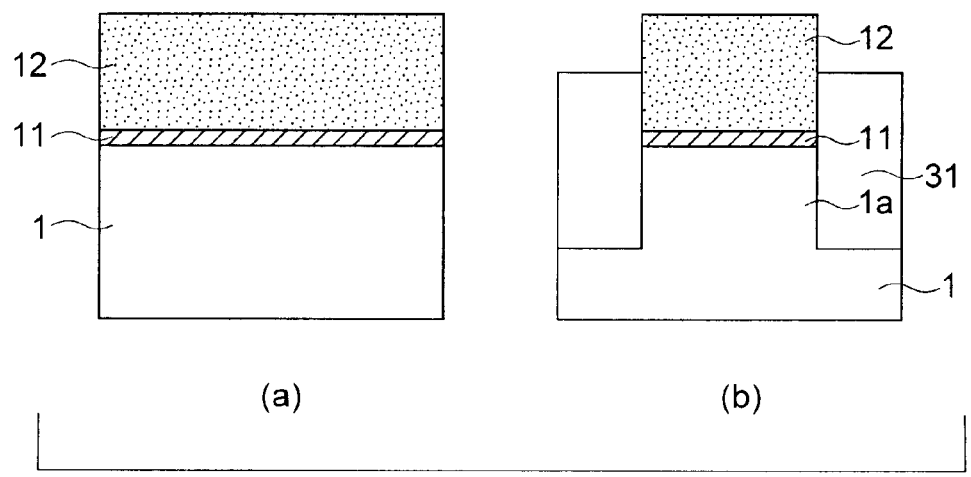

Next, as illustrated in FIGS. 6(*a*) and 6(*b*), the exposed stopper film 13 is selectively removed by etching, and the exposed surface of the silicon oxide film 31 is removed by etching using a diluted hydrofluoric acid solution to make the sidewall surfaces of the polysilicon layer 12 be exposed.

Figure 7:
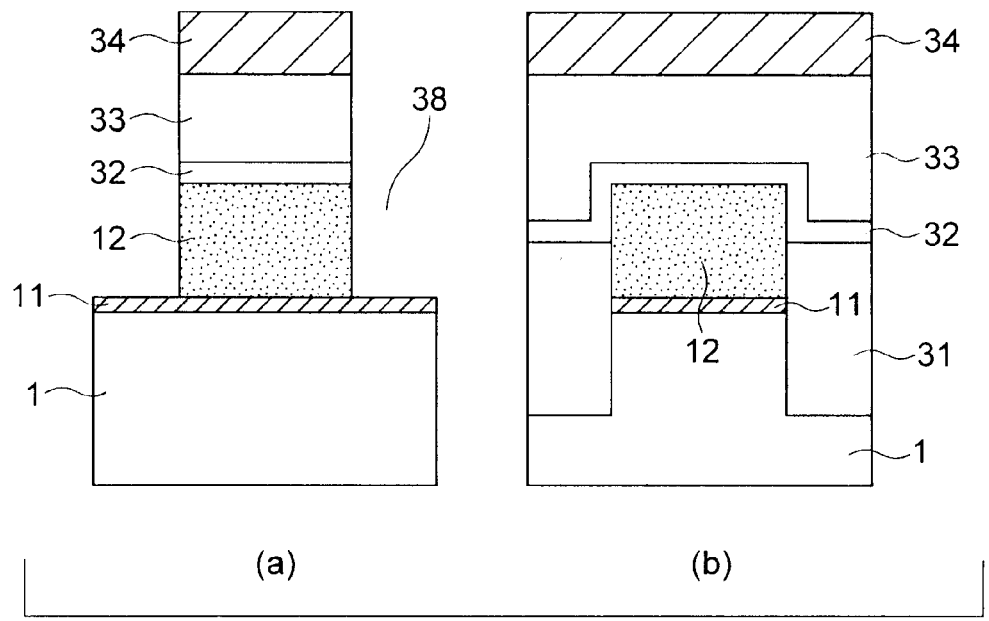

Next, as illustrated in FIGS. 7(*a*) and 7(*b*), an inter electrode insulating film 32 with a thickness of 15 nm, the inter electrode insulating film 32 having a three-layer structure consisting of a silicon oxide film, a silicon nitride film and a silicon oxide film is formed over the entire surface by sequentially depositing these films by reduced-pressure CVD. A conductive layer 33 with a thickness of 100 nm, the conductive layer 33 having a two-layer structure consisting of a polysilicon layer and a tungsten silicide layer and becoming control gate electrodes, is formed by sequentially depositing these films by reduced-pressure CVD. A mask film 34 for RIE is deposited by reduced-pressure CVD.

Next, the mask film 34, the conductive layer 33, the inter electrode insulating film 32 and the polysilicon layer 12 are sequentially processed by RIE to form slit parts 38 between the stacked cells.

Next, as illustrated in FIGS. 8(*a*) and 8(*b*), a silicon oxide film 35 with a thickness of 10 nm, which is called an electrode sidewall oxide film, is formed on the exposed surface using anisotropic oxidation, and then a cell diffusion layer 39 is formed using ion implantation. Furthermore, a silicon oxide film 36, which serves an inter layer dielectric, is formed by reduced-pressure CVD so as to cover the entire surface. Subsequently, an interconnect layer 37, etc., is formed by known methods to complete nonvolatile memory cells.

Figure 13:
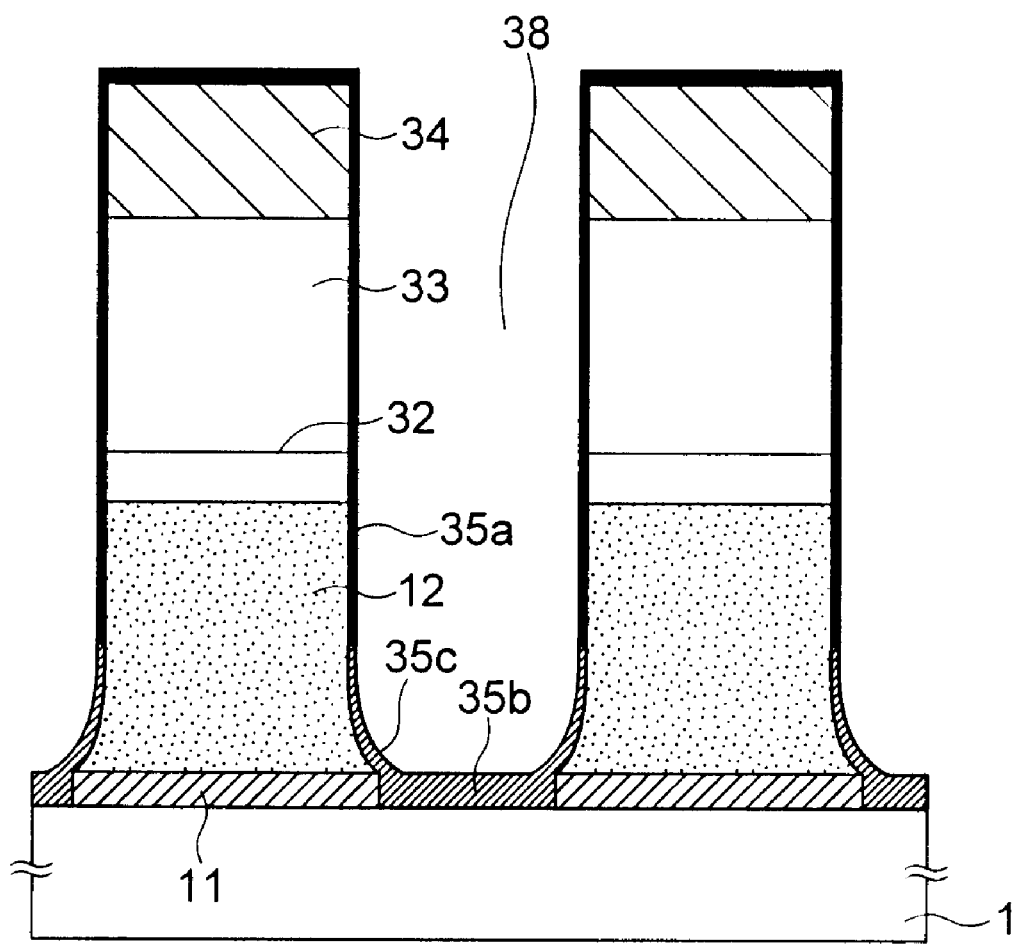

Here, FIG. 13 is a more detailed illustration of the structure at the stage of the silicon oxide films 35*a*, 35*b* and 35*c* having been formed by anisotropic oxidation in the cross-section illustrated in FIG. 8(*a*). In modification 1, the RIE-process conditions are adjusted so that the width of the floating gate electrodes 12, which consist of the polysilicon layer, increases toward the lower parts (i.e., so that the floating gate electrodes 12 have a skirt shape in cross-section), which is different from FIG. 9 illustrating the cross-section in the first embodiment.

In this case, also, as in the first embodiment, oxidation of the sidewall parts of the floating gate electrodes 12 and the control gate electrodes 33 is suppressed, enabling the thickness of the silicon oxide film 35*a* on these parts to be thin, and the bottom parts of the slit parts 38 and the skirt shape parts of the lower end parts of the floating gate electrodes 12 are selectively oxidized, enabling the thickness of the silicon oxide films 35*b* and 35*c* on these parts to be thick. In particular, although the lower ends of the floating gate electrodes 12 form sharp angles, resulting in enlargement of an electric field during writing/erasing operation for the memory cells, such electric field enlargement can be suppressed by forming the silicon oxide film 35*c* on these parts to be thick. Consequently, the reliability of the memory cells can be improved. Here, although FIG. 13 illustrates the case where the tunnel insulating film 11 in the slit parts 38 is entirely oxidized down to its interface with the silicon substrate 1, only the surface parts of the tunnel insulating film 11 may be partially oxidized, by performing the anisotropic oxidation shorter or at lower temperature, or changing the material of the tunnel insulating film to such a material that is not easily oxidized. Also, although the silicon oxide film 35*a* is formed also on the sidewall parts of the inter electrode insulating film 32, the sidewall parts of the mask film 34 and the upper parts of the mask film 34, it may not be formed on them depending on their materials.

(4) Comparative Example 2 for Modification 1 for the First Embodiment

A method of manufacturing a semiconductor device according to comparative example 2 for modification 1 for the first embodiment will be described.

Figure 14:
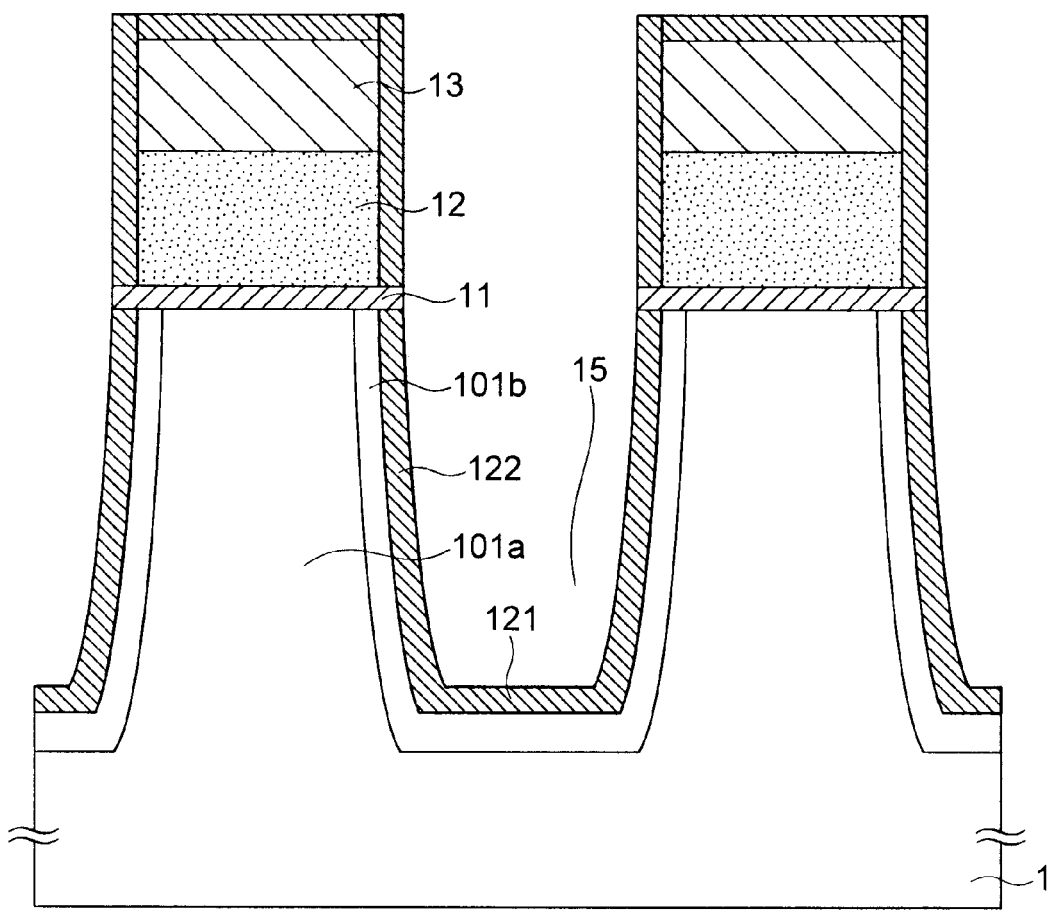
FIGS. 14 and 15 are longitudinal cross sectional views showing a method of manufacturing a semiconductor device according to comparative example 2 for the first embodiment.

As illustrated in FIG. 14, in comparative example 2, silicon oxide films 121 and 122 are formed by performing not anisotropic oxidation, but isotropic oxidation using thermal oxidation. In this method, the silicon oxide film 122 having a thickness substantially equal to that of the silicon oxide film 121 on the bottom parts of isolation trenches 15 are formed on the sidewall parts of protruding parts 101*a* of a semiconductor substrate 101. Consequently, the width of the protruding parts of the silicon substrate becomes smaller at the bottom parts of the isolation trenches 15, causing punch-through. Here, although in FIG. 14, the silicon oxide film 122 is not formed on the sidewall parts of the tunnel insulating film 11, it may be formed on them depending on the material. Also, although the silicon oxide film 122 is formed also on the sidewall parts of the stopper film 13 and the upper surface parts of the stopper film 13, it may not be formed on them depending on the material.

Also, in a nonvolatile memory, the silicon oxide film 122 having a large thickness, which is formed on the sidewall parts of the protruding parts 101*a*, increases the amount of dopant drawn out from channel edges 101*b*, causing fluctuation in the boost ratio.

Furthermore, a silicon oxide film formed using thermal oxidation exhibits a breakdown resistance lower than that of a silicon oxide film using the anisotropic oxidation under the substrate temperature of 300° C. or higher according to the modification of the first embodiment.

Figure 15:
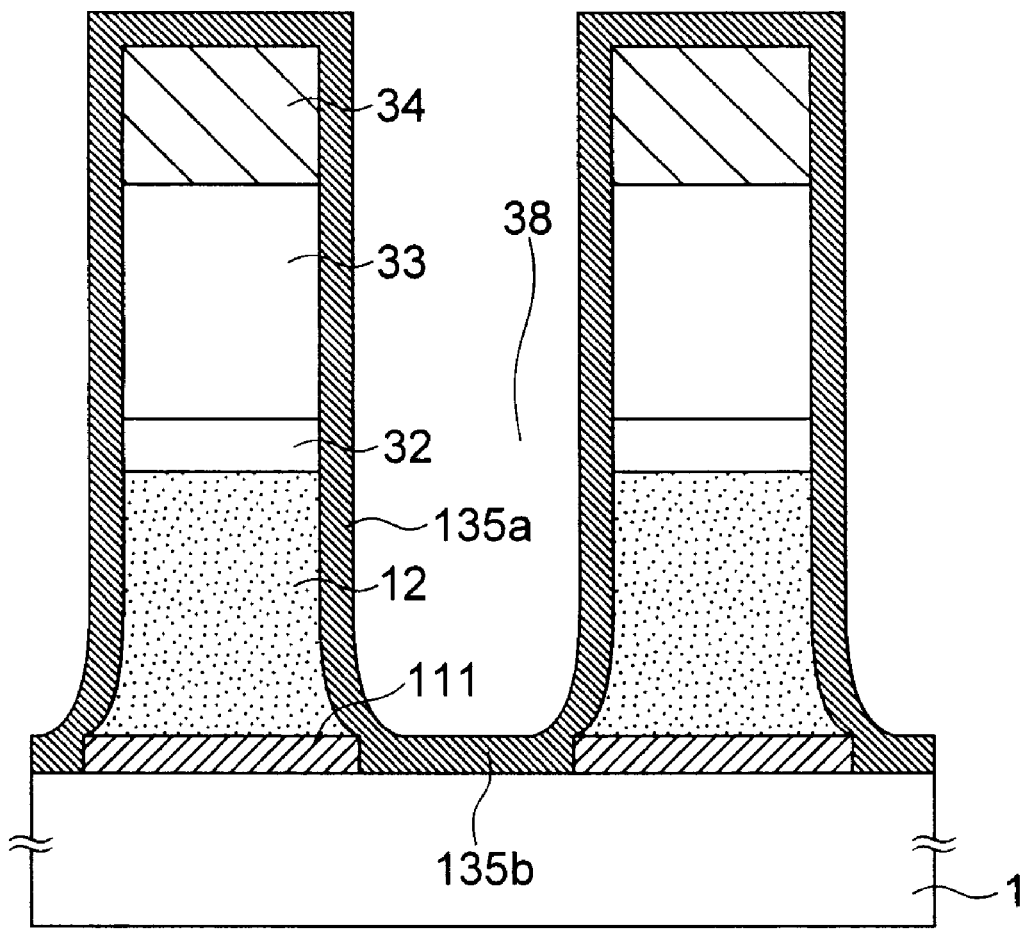

FIG. 15 illustrates a cross-sectional structure in comparative example 2, which corresponds to the process step illustrated in FIG. 13 in the modification of the first embodiment. In this modification, as a result of using isotropic oxidation instead of anisotropic oxidation, the thickness of the silicon oxide film 135*a* forming the sidewall parts of the floating gate electrodes 12 and the control gate electrodes 33 and the thickness of the silicon oxide film 135*b* forming the bottom parts of slit parts 38 are substantially equal to each other, and accordingly the floating gate electrodes 12 and the control gate electrodes 33 become narrow. Here, although FIG. 15 illustrates the case where the tunnel insulating film 111 in the slit parts 38 is entirely oxidized down to its interface with the silicon substrate 1, only the surface parts of the tunnel insulating film 111 may be partially oxidized, depending on the material of the tunnel insulating film. Also, although the silicon oxide film 35*a* is formed also on the sidewall parts of an inter electrode insulating film 32, the sidewall parts of a mask film 34 and the upper surface parts of the mask film 34, it may not be formed depending on their materials.

(5) Second Embodiment

A method of manufacturing a semiconductor device according to a second embodiment of the present invention will be described. The second embodiment corresponds to an example of applying the present invention to transistor elements.

Figure 16:
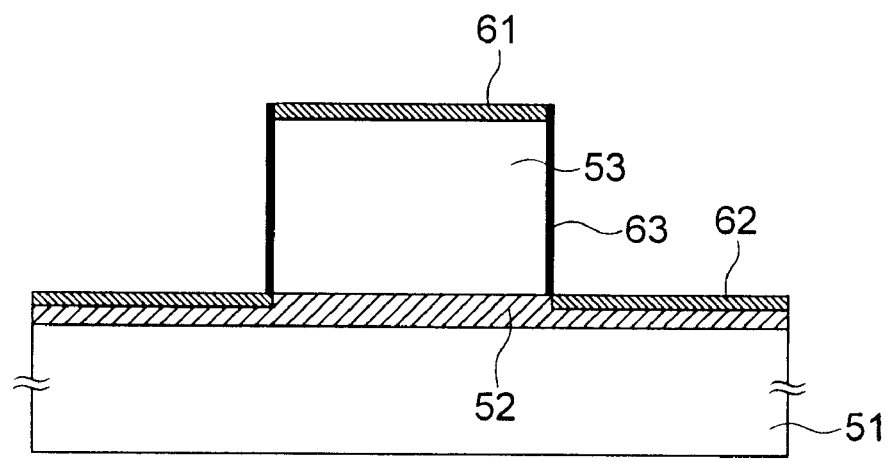
FIG. 16 is a longitudinal cross sectional view showing a method of manufacturing a semiconductor device according to a second embodiment.

As illustrated in FIG. 16, a gate insulation film 52 is formed on the surface of a semiconductor substrate 51. Then, materials for gate electrodes, for example, a polysilicon layer doped with phosphorus, a metal compound, a metal silicide and the like are deposited on the surface, and processed to be formed in the shape of gate electrodes 53 (one of which is shown).

Using the anisotropic oxidation described in first embodiment, oxidizing ions are generated by means of microwaves, radio-frequency waves or electron cyclotron resonance, and a radio-frequency wave voltage of, for example, 10 to 100 V is applied to the semiconductor substrate 51. The oxidizing ions are accelerated toward the semiconductor substrate 51 and substantially perpendicularly enter the surface of the semiconductor substrate 51. Oxidation of the sidewalls of the gate electrode 53 is suppressed, making a silicon oxide film 63 on these parts be thin, and a silicon oxide film 62 on the exposed gate insulation film 52 and a silicon oxide film 61 on the gate electrode 53 are selectively oxidized, to make their film thicknesses be large. Here, although FIG. 16 illustrates the case where the upper parts of the gate insulation film 52 are oxidized, the gate insulation film may be entirely oxidized, by performing the anisotropic oxidation longer or at higher temperature, or changing the material of the gate insulation film to such a material that is easily oxidized. Alternatively, the oxidation may extend to the surface parts of the silicon substrate 51 in the exposed gate insulation film regions.

Consequently, the reliability of the gate insulation film 52 can be improved while suppressing a decrease in the width of the gate electrodes 53 due to the oxidation of the sidewalls of the gate electrodes 53. In the subsequent process, an inter layer dielectric, contact holes, an interconnect layer are formed to complete transistor elements.

(6) Comparative Example 3 for the Second Embodiment

A method of manufacturing a semiconductor device according to comparative example 3 for the second embodiment will be described.

Figure 17:
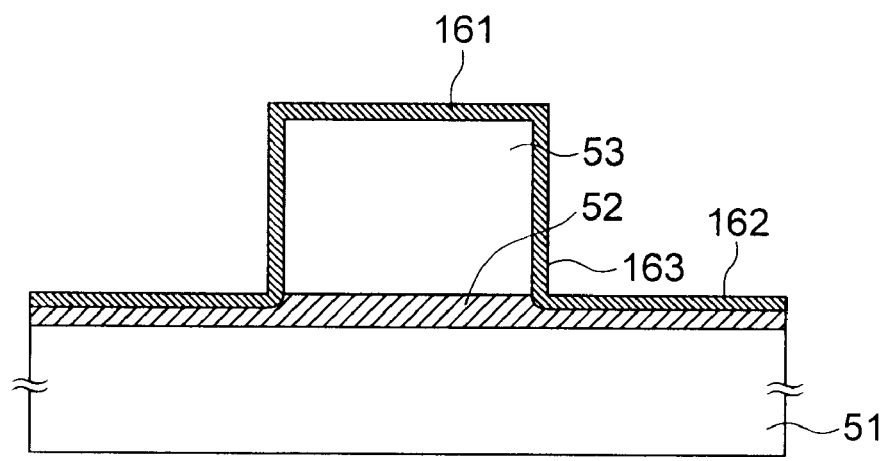
FIG. 17 is a longitudinal cross sectional view showing a method of manufacturing a semiconductor device according to comparative example 3 for the second embodiment.

As illustrated in FIG. 17, a gate insulation film 52 is formed on the surface of a semiconductor substrate 51, and gate electrodes (only one of which is shown) 53 are further formed on the surface.

The surface and sidewalls of the gate electrode 53 and the gate insulation film 52 are oxidized using isotropic thermal oxidation, which is different from the anisotropic oxidation in the first embodiment, to form silicon oxide films 161, 163 and 162 having film thicknesses equal to each other. As a result, the sidewalls of the gate electrode 53 are oxidized, resulting in the width of the gate electrode 53 being smaller. Here, although in FIG. 17, the upper parts of the gate insulation film 52 are oxidized, the entire gate insulation film may be oxidized depending on the material of the gate insulation film. Alternatively, the oxidation may extend to the surface parts of the silicon substrate 51 in the exposed gate insulation film regions.

(7) Modification 2 for the Second Embodiment

A method of manufacturing a semiconductor device according to modification 2 for the second embodiment of the present invention will be described. Modification 2 corresponds to an example of applying the present invention to transistor elements.

Figure 18:
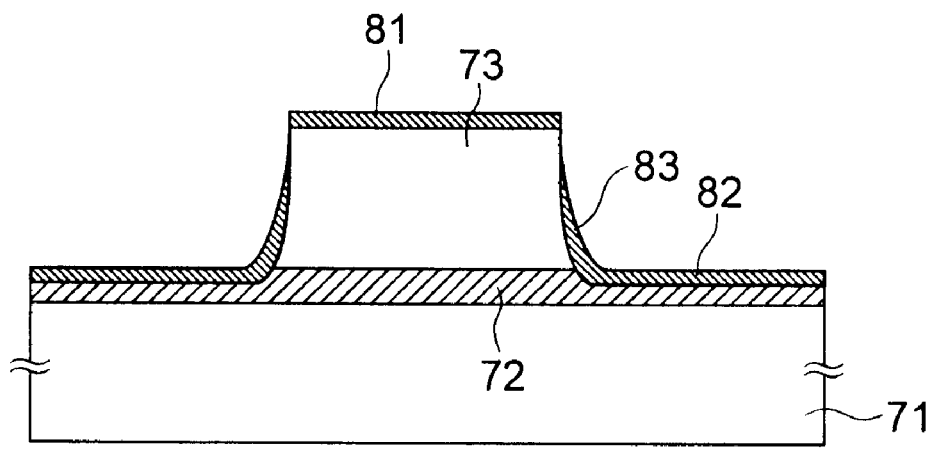
FIG. 18 is a longitudinal cross sectional view showing a method of manufacturing a semiconductor device according to modification 2 for the second embodiment.

As illustrated in FIG. 18, a gate insulation film 72 is formed on the surface of a semiconductor substrate 71. Then, materials for gate electrodes, for example, a polysilicon layer doped with phosphorus, a metal compound, a metal silicide and the like are deposited on the surface, and processed by RIE so that the width of gate electrodes 73 (only one of which is shown) increases toward their lower parts. In other words, the gate electrode 73 is processed so that it has a width increasing toward its interface with the gate insulation film 72.

Using the anisotropic oxidation described in the first embodiment oxidizing ions are generated by microwaves, radio-frequency waves or electron cyclotron resonance, and a radio-frequency wave voltage of, for example, 10 to 100 V is applied to the semiconductor substrate 71. Oxidizing ions are accelerated toward the semiconductor substrate 71 and substantially perpendicularly enter the surface of the semiconductor substrate 71. Oxidation of the sidewalls of the gate electrode 73 is suppressed, making the thickness of a silicon oxide film 83 on these parts be small, and a silicon oxide film 82 on the exposed gate insulation film 72 and a silicon oxide film 81 on the surface of the gate electrode 73 are selectively oxidized to make their film thicknesses be large. The thickness of the silicon oxide film 83 on the sidewall parts of the gate electrode 73 gradually increases from the upper regions to the lower regions of the sidewall parts of the gate electrode 73. Here, although FIG. 18 illustrates the case where the upper parts of the gate insulation film 72 are oxidized, the gate insulation film 72 may be entirely oxidized, by performing the anisotropic oxidation longer or at higher temperature, or changing the material of the gate insulation film to such a material that is easily oxidized. Alternatively, the oxidation may extend to the surface parts of the silicon substrate 71 in the exposed regions of the gate insulation film.

Consequently, even where the width of the gate electrodes 73 increases toward their lower parts and the electric field in the lower parts thereby increases, a decrease in the width of the gate electrodes 73 can be suppressed, and the reliability of the gate insulation film 72 can be enhanced notably. In the subsequent process, an inter layer dielectric and contact holes are formed using known methods to complete transistor elements.

(8) Comparative Example 4 for Modification 2 for the Second Embodiment

A method of manufacturing a semiconductor device according to comparative example 4 for modification 2 for a second embodiment of the present invention will be described. As in modification 2, comparative example 4 relates to a transistor element manufacturing method.

Figure 19:
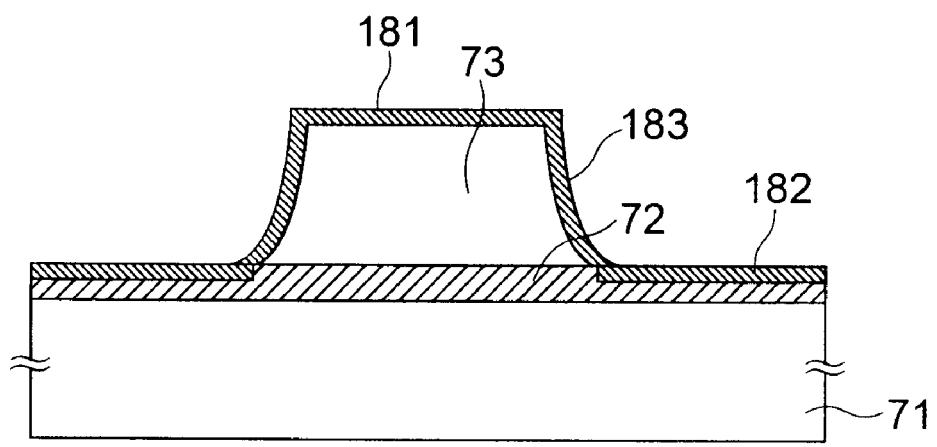
FIG. 19 is a longitudinal cross sectional view showing a method of manufacturing a semiconductor device according to comparative example 4 for modification 2 for the second embodiment.

As illustrated in FIG. 19, a gate insulation film 72 is formed on the surface of a semiconductor substrate 71. Then, materials for gate electrodes, for example, a polysilicon layer doped with phosphorus, a metal compound, a metal silicide and the like are deposited on the surface, and processed by RIE so that the width of gate electrodes 73 (only one of which is shown) increases toward their lower parts.

Using isotropic thermal oxidation, which is different from modification 2, a silicon oxide film 183 is formed on the sidewalls of the gate electrode 73 and a silicon oxide film 182 is formed on the exposed gate insulation film 72 so as to have thicknesses substantially equal to each other by subjecting these parts to the same degree of oxidation. Here, although in FIG. 19, the upper regions of the gate insulation film 72 are oxidized, the entire gate insulation film may be oxidized depending on the material of the gate insulation film. Alternatively the oxidation may extend to the surface parts of the silicon substrate 71 in the exposed gate insulation film regions.

Consequently, even where the width of the gate electrodes 73 increases toward their lower parts, the width of the gate electrodes 73 becomes small.

(9) Third Embodiment

A method of manufacturing a semiconductor device according to a third embodiment of the present invention will be described. The third embodiment corresponds to an example of applying the present invention to a nonvolatile memory, in which silicon nitride films are formed using anisotropic nitridation.

As illustrated in FIGS. 20(a) and 20(b), through the process steps illustrated in FIGS. 2 and 3 in the first embodiment, a tunnel insulating film 202 with a thickness of 10 nm, a polysilicon layer 203 with a thickness of 150 nm, the polysilicon layer 203 being doped with phosphorus, a stopper film 204 and a mask film 205 are sequentially deposited by reduced-pressure CVD on the surface of a semiconductor substrate 201 doped with a desired impurity.

Here, FIGS. 20(a), 21(a), 22(a) and 23(a) correspond to cross-sectional views in the bit-line (channel-length) direction, and FIGS. 20(b), 21(b), 22(b) and 23(b) correspond to cross-sectional views in the word-line (channel-width) direction.

The mask film 205, the stopper film 204, the polysilicon layer 203 and the tunnel insulating film 202 are sequentially etched and the exposed regions of the semiconductor substrate 201 are etched to form isolation trenches 206 with a depth of 150 nm.

Next, using the above-described anisotropic nitridation, nitriding ions are generated by microwaves, radio-frequency waves or electron cyclotron resonance, and a radio-frequency wave voltage of, for example, 10 to 100 V is applied to the semiconductor substrate 201. Consequently, the nitriding ions are accelerated toward the semiconductor substrate 201 and substantially perpendicularly enter the semiconductor substrate 201. Consequently, nitridation of the sidewall parts of a semiconductor substrate 201a, which is left unprocessed in the shape of protrusions (only one of which is shown), and a floating gate electrode 203 is suppressed, forming a silicon nitride film 207 having a small thickness of, for example, 1 nm, and the bottom parts of the isolation trenches 206 are selectively nitrided, forming a silicon nitride film 208 having a large thickness of, for example, 3 nm. Here, although in FIG. 20, the silicon nitride film 207 is formed also on the sidewall parts of the tunnel insulating film 202, the sidewall parts of the stopper film 204, the sidewall parts of the mask film 205 and the upper surface part of the mask film 205, it may not be formed on them depending on their materials.

Consequently, etching process damage in the bottom parts of the isolation trenches 206 can be removed with almost no reduction of the width (channel width) of the semiconductor substrate 201a between the isolation trenches 206. As a result, punch-through can be effectively suppressed without deterioration of the reliability of the memory cells.

Moreover, in the process step of depositing a silicon insulating film 209 formed of a silicon oxide film or a silicon oxynitride film, which fills the isolation trenches 206, by means of, e.g., CVD after removal of the mask film 205, which is illustrated in FIGS. 21(a) and 21(b), the existence of the silicon nitride film 208 having a large film thickness on the bottom parts of the isolation trenches 206 enables the start time (so-called the incubation time) for deposition on the bottom parts to be delayed compared to the start time for deposition on the sidewall parts of the silicon nitride film 207.

As a result, the difference between deposition thicknesses on the sidewall and bottom parts due to the low deposition rate for the sidewall parts and the high deposition rate for the bottom parts can be reduced, enabling depositing the isolation insulating films conformally. Consequently, isolation insulating films 209 having cavities 210 of the same shape around their centers can be formed.

Figure 20:
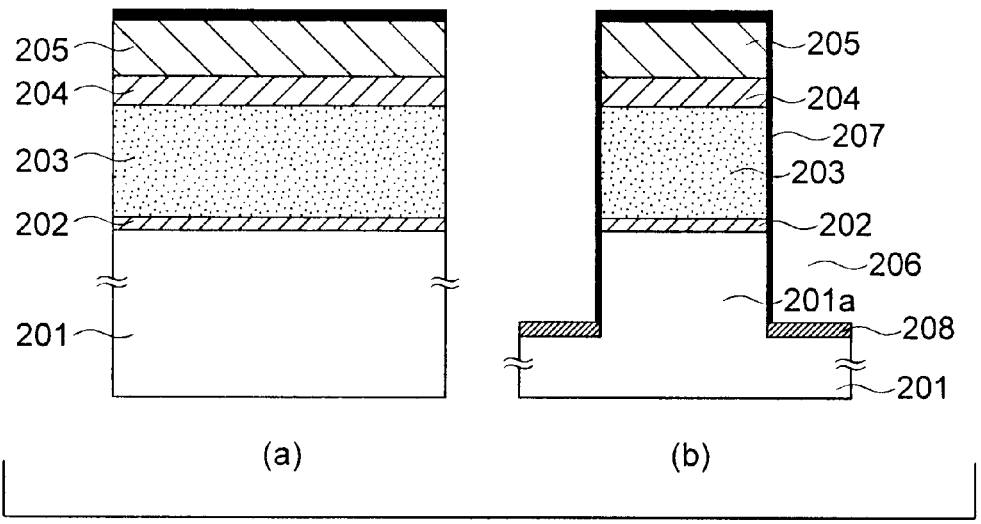
FIGS. 20 to 23 are longitudinal cross sectional views showing a method of manufacturing a semiconductor device according to a third embodiment.
Figure 21:
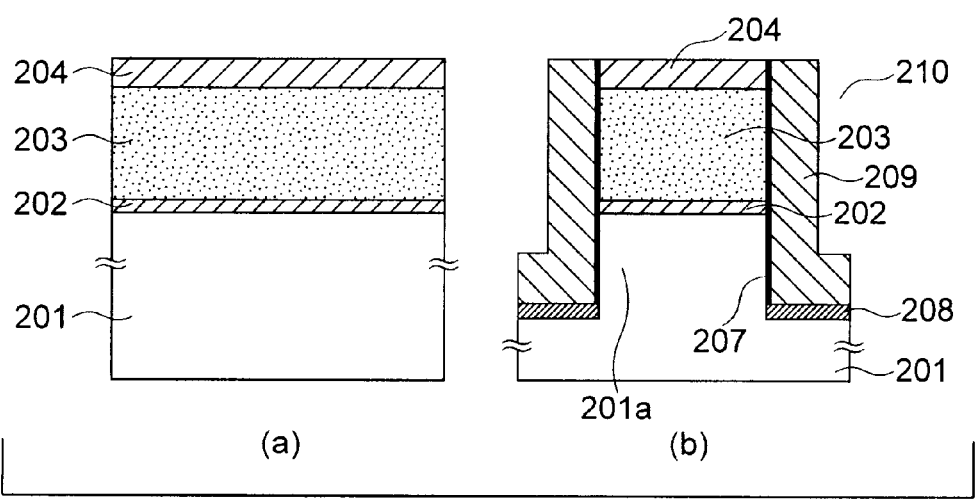

In the step shown in FIG. 20, the deposition of the stopper film 204 may be omitted. In this case, in the step shown in FIG. 21, the polysilicon layer 203 can be used as a stopper. The omission of the deposition of the stopper film 204 makes the etching process by RIE to be performed easier.

In the subsequent process, as illustrated in FIGS. 22(a) and 22(b), the stopper film 204 is removed, and an inter electrode insulating film 211, a conductive layer 212 and a mask film 213 are deposited on the polysilicon film 203.

Next, by means of RIE using a resist film (not shown), the mask film 213, the conductive layer 212, the inter electrode insulating film 211 and the polysilicon layer 203 are sequentially etched to form slit parts 214 between the stacked cells. The tunnel insulating film 202 is an example of a first film to be processed in the present invention, and a film including the polysilicon layer 203, the inter electrode insulating film 211, and the conductive layer 212 is an example of a second film to be processed in the present invention.

Next, using anisotropic nitridation, nitriding ions are generated by microwaves, radio-frequency waves or electron cyclotron resonance, and a radio-frequency wave voltage of, for example, 10 to 100 V is applied to the semiconductor substrate 201.

Consequently, nitriding ions are accelerated toward the semiconductor substrate 201 and substantially perpendicularly enter the semiconductor substrate 201, whereby nitridation of the sidewalls of floating gate electrodes formed of the polysilicon film 203, the inter electrode insulating film 211 and control gate electrodes formed of the conductive layer 212 is suppressed, and the exposed tunnel insulating film 202 is selectively nitrided.

Figure 22:
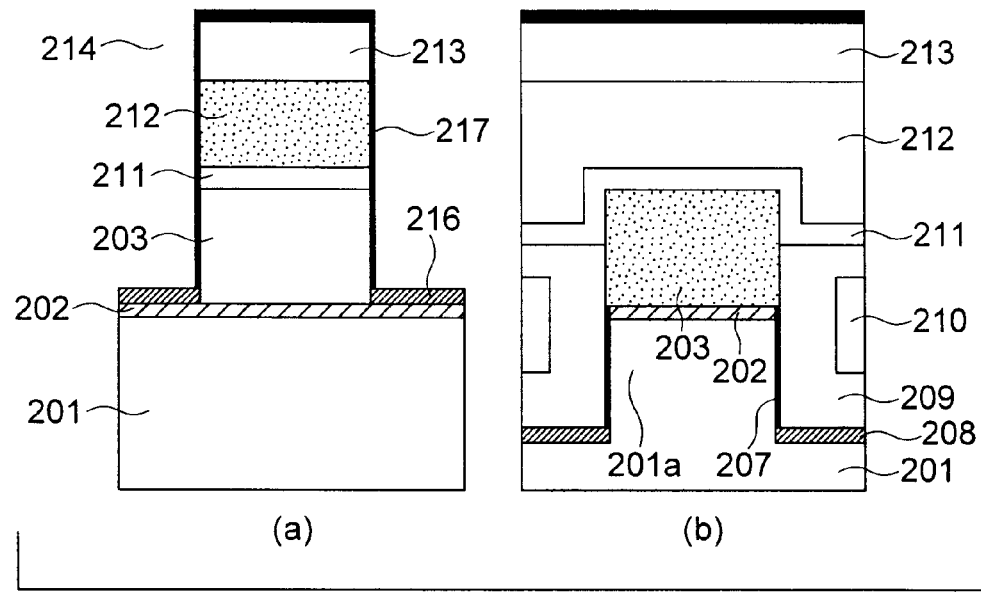
Figure 23:
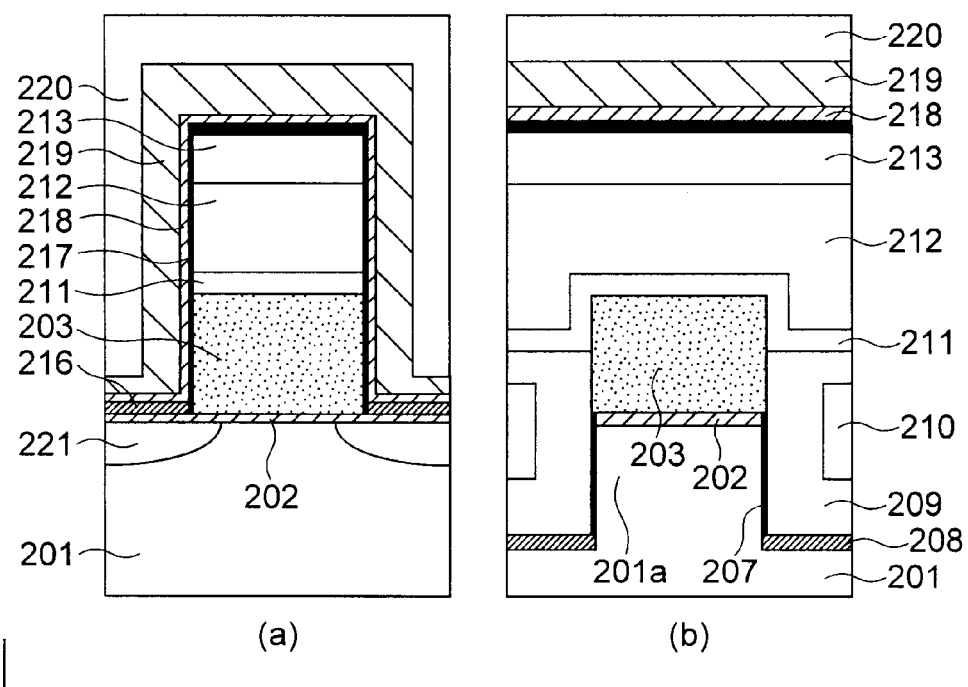

Consequently, the silicon nitride film 217 having a small thickness of, for example, 1 nm is formed on the sidewalls of the slit parts 214, and the silicon nitride film 216 having a large thickness of, for example, 3 nm is formed on the upper surface of the tunnel insulating film 202, enabling the reliability of the tunnel insulating film 202 to be improved while preventing interference between adjacent cells. Here, although FIG. 22 illustrates the case where the upper regions of the tunnel insulating film 202 are nitrided, the surface parts of the silicon substrate 1 of the slit parts may be also nitrided, by performing the anisotropic nitridation longer or at higher temperature, or changing the material of the tunnel insulating film to such a material that is easily nitrided. Also, although the silicon nitride film 217 is formed also on the sidewall parts of the inter electrode insulating film 211, the sidewall parts of the mask film 213 and the upper part of the mask film 213, it may not be formed on them depending on their materials. In the subsequent process, as illustrated in FIG. 23, a silicon oxide film 218 is formed, and then a cell diffusion layer 221 is formed using ion implantation. Furthermore, a silicon oxide film 219 and a silicon oxide film 220, which serve as an inter layer dielectric, are formed by reduced-pressure CVD so as to cover the entire surface. Subsequently, an interconnect layer (not shown) and the like are formed to complete nonvolatile memory cells.

According to the third embodiment, etching process damage in the bottom parts of the isolation trenches 206 can be removed with almost no reduction of the width (channel width) of the semiconductor substrate 201a between the isolation trenches 206. Consequently, punch-through can be effectively suppressed without deterioration of the reliability of the memory cells. Moreover, when depositing a silicon insulating film in isolation trenches, a silicon nitride film having a large thickness is formed on the bottom parts of the isolation trenches in advance, enabling the start time for deposition on the bottom parts of the isolation trenches be delayed compared to that of the sidewall parts, whereby the difference between the thicknesses of the films deposited on the sidewall parts and the bottom parts can be reduced, enabling formation of isolation insulating films 209 having cavities of the same shape around their centers. This enables to prevent interference between adjacent cells due to a parasitic capacitance in the word-line direction (channel width direction).

Also, according to the third embodiment, nitridation of the sidewall parts of the floating gate electrodes and the control gate electrodes is suppressed, enabling the reliability of the tunnel insulating film to be enhanced while preventing the interference between adjacent cells due to the parasitic capacitance in the bit-line direction (channel length direction). Also, positive fixed charge in the silicon nitride film 216 can lower the resistance of the diffusion layer 221, increasing on-state current for the memory cells, enabling a high-speed memory operation.

(10) Fourth Embodiment

A method of manufacturing a semiconductor device according to a fourth embodiment of the present invention will be described. The fourth embodiment corresponds to an example of applying the present invention to transistor elements.

Figure 24:
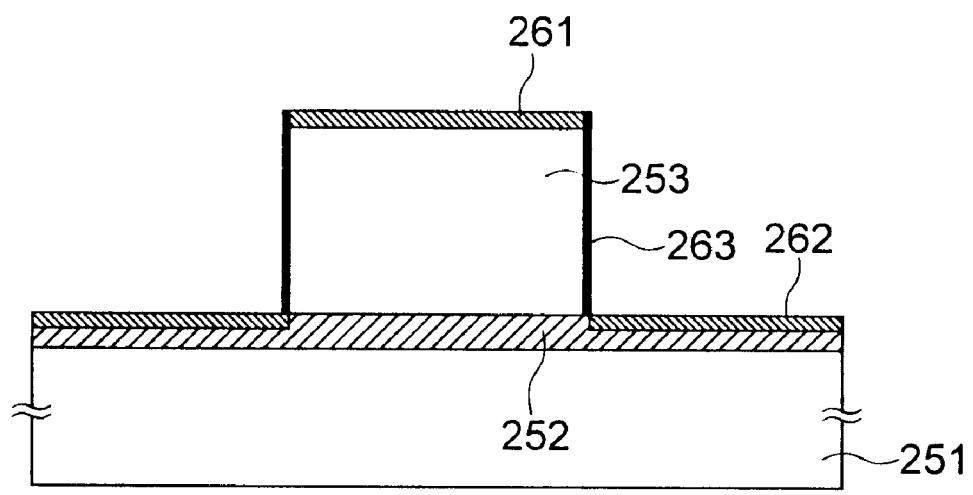
FIG. 24 is a longitudinal cross sectional view showing a method of manufacturing a semiconductor device according to a fourth embodiment.

As illustrated in FIG. 24, a gate insulation film 252 is formed on the surface of a semiconductor substrate 251, and as a material for gate electrodes, for example, a polysilicon layer doped with phosphorus is deposited and processed by RIE to have the shape of gate electrodes 253 (one of which is shown).

Using anisotropic nitridation, nitriding ions are generated by microwaves, radio-frequency waves or electron cyclotron resonance. By applying a radio-frequency wave voltage of, for example, 10 to 100 V to the semiconductor substrate 251, the nitriding ions are accelerated toward the semiconductor substrate 251 and substantially perpendicularly enter the semiconductor substrate 251.

Consequently, nitridation of the sidewall parts of the gate electrode 253 is suppressed, making the thickness of the silicon nitride film 263 on these parts be small, the exposed gate insulation film 252 is selectively nitrided, making the thickness of the silicon nitride film 262 on these parts be large. Consequently, the reliability of the gate insulation film 252 can be improved.

In the subsequent process, an inter layer dielectric, contact holes and an interconnect layer are formed to complete transistor elements.

Since the gate insulation film can be selectively nitrided while suppressing nitridation of the gate electrode sidewall parts, the reliability of the gate insulation film can be improved while suppressing a decrease in the width of the gate electrodes to avoid short channel effect. Also, reliability deterioration of transistor elements due to stress caused by the silicon nitride film on the gate electrode sidewall parts can be reduced.

(11) Fifth Embodiment

A method of manufacturing a semiconductor device according to a fifth embodiment of the present invention will be described. The fifth embodiment corresponds to an example of applying the present invention to transistor elements. This manufacturing method is applied to the case where a metal material with a limited tolerable manufacturing process temperature is used for a material for gate electrodes.

Figure 25:
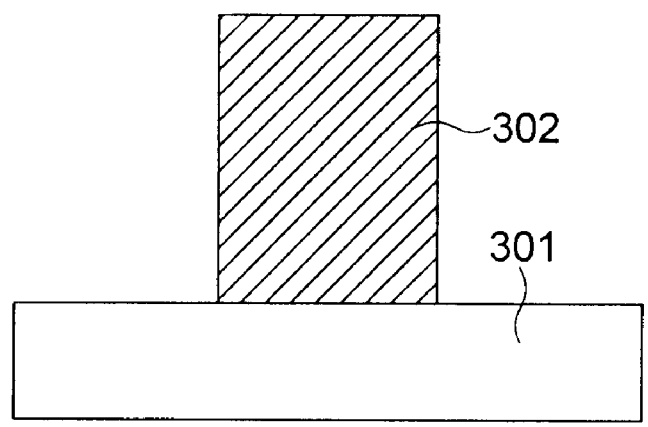
FIGS. 25 to 28 are longitudinal cross sectional views showing a method of manufacturing a semiconductor device according to a fifth embodiment.

As illustrated in FIG. 25, a polysilicon film with a thickness of, e.g., 150 nm, which becomes a dummy gate film, is deposited by reduced-pressure CVD (Chemical Vapor Deposition) on the surface of a semiconductor substrate 301 doped with a desired impurity. By means of RIE using a resist mask (not shown), the polysilicon film is etched to form a dummy gate film 302 and make parts of the semiconductor substrate 301 be exposed.

Figure 26:
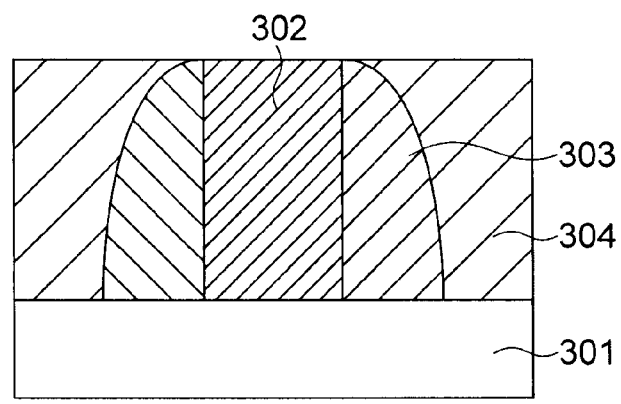

Next, as illustrated in FIG. 26, an insulating film, such as a silicon nitride film, for example, is deposited on the dummy gate film 302 and processed by RIE so that an insulating film 303 remains only on the sidewalls of the dummy gate film 302. Furthermore, after depositing an insulating film 304, CMP is performed to planarize the surface to be at the same level as the dummy gate film 302.

Figure 27:
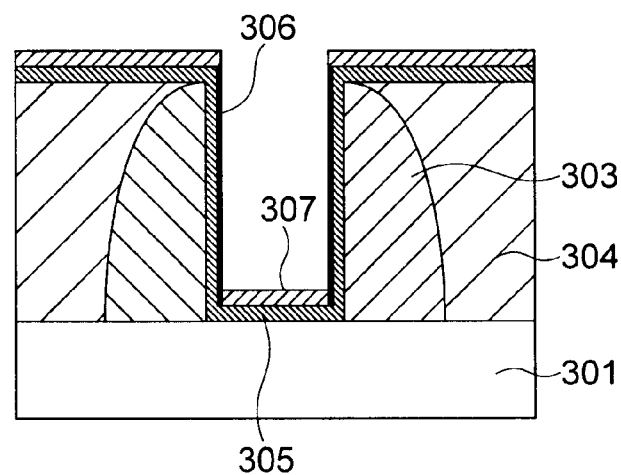

Next, as illustrated in FIG. 27, after removing the dummy gate film 302 by etching, insulating films 305 and 306 each having a thickness of 2 nm are formed on the entire exposed surface. Here, the insulating film 305 is formed on the surface of the semiconductor substrate 301 surrounded by the insulating film 303, and serves as a gate insulation film. Also, the insulating film 306 is formed on the sidewall parts of the insulating film 303.

Furthermore, using anisotropic oxidation, oxidizing ions are generated by means of microwaves, radio-frequency waves or electron cyclotron resonance, and a radio-frequency wave voltage of, for example, 10 to 100 V is applied to the semiconductor substrate 301. The oxidizing ions are accelerated toward the semiconductor substrate 301 and substantially perpendicularly enter the semiconductor substrate 301, whereby the oxidation of the insulating film 306 on the sidewall parts is suppressed, making the film thickness be small, and the gate insulation film 305 exposed on the bottom surface is selectively oxidized, making oxidation reforming regions 307 (one of which is shown) on the gate insulation film 305 have a large thickness.

Figure 28:
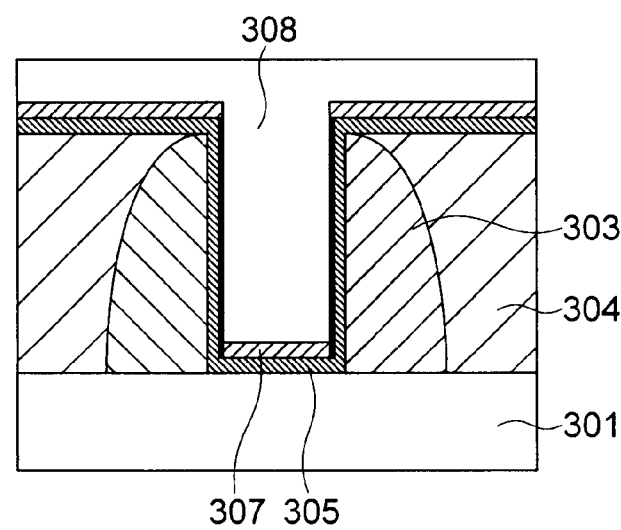

In the subsequent process, as illustrated in FIG. 28, a metal or a metal compound is deposited to form a gate electrode 308, and an inter layer dielectric, contact holes and an interconnect layer are formed to complete transistor elements.

According to the fifth embodiment, the gate insulation film 305 is selectively oxidized while suppressing oxidation of the sidewall parts of the insulating film 306, enabling the reliability of the gate insulation film to be enhanced while suppressing a decrease in the width of the gate electrodes to avoid short channel effect. Also, it is possible to suppress oxidation of the gate electrodes 308 due to an oxidant diffusing from the insulating film 303 and/or the insulating film 304 during the subsequent process, because surface parts of the insulating film 306 on the sidewall parts are oxidized by oxidizing ions.

(12) Sixth Embodiment

A method of manufacturing a semiconductor device according to a sixth embodiment of the present invention will be described. The sixth embodiment corresponds to an example of applying the present invention to a nonvolatile memory.

Figure 29:
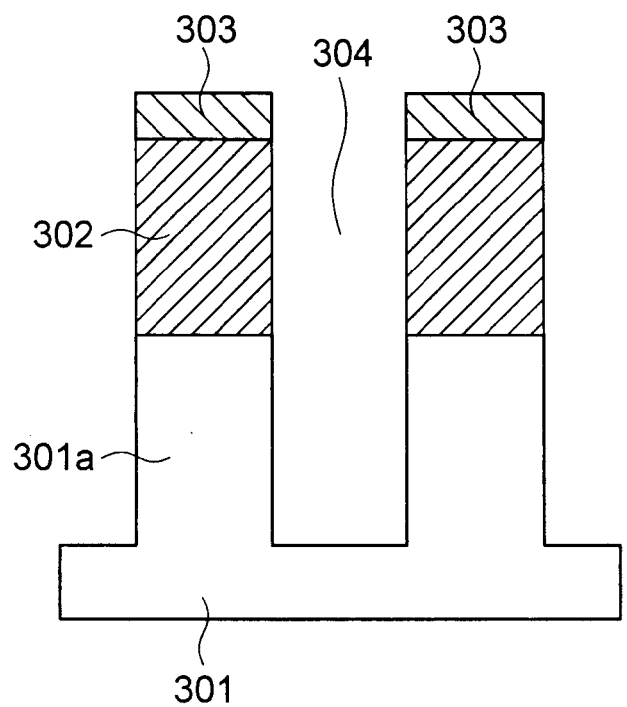
FIGS. 29 to 32 are longitudinal cross sectional views showing a method of manufacturing a semiconductor device according to a sixth embodiment.

As illustrated in FIG. 29, a silicon nitride film 302 with a thickness of 100 nm is formed by reduced-pressure CVD on the surface of a semiconductor substrate 301 doped with a desired impurity, and a mask film 303 for RIE is deposited by reduced-pressure CVD.

By means of RIE using a resist mask (not shown), the mask film 303 and the silicon nitride film 302 are sequentially etched, and furthermore, the exposed regions of the semiconductor substrate 301 are etched to form isolation trenches 304 with a depth of 150 nm.

Figure 30:
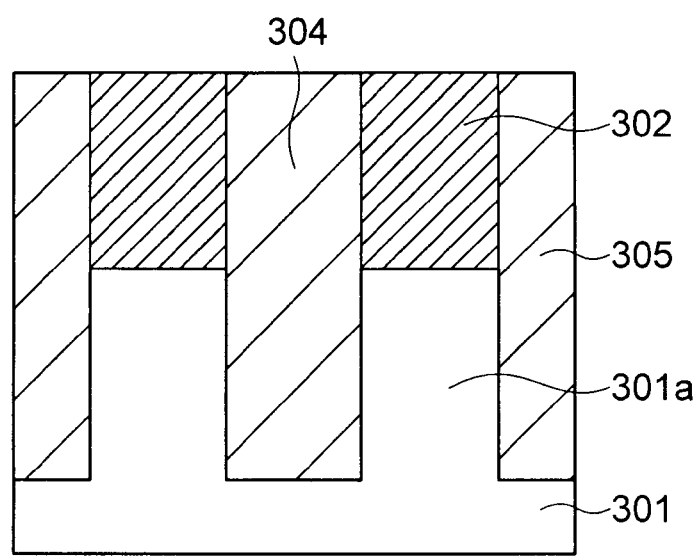

Next, as illustrated in FIG. 30, a silicon oxide film with a thickness of 5 nm (not shown) is formed by thermal oxidation on the exposed surface of the semiconductor substrate 301. A silicon oxide film 305 with a thickness of 400 nm, which is an insulating film for isolation, is deposited on the entire surface by plasma CVD to fill the isolation trenches 304. The surface parts of the silicon oxide film 305 are removed by CMP to planarize the surface. At this stage, the surface of the silicon nitride film 302 is exposed.

Figure 31:
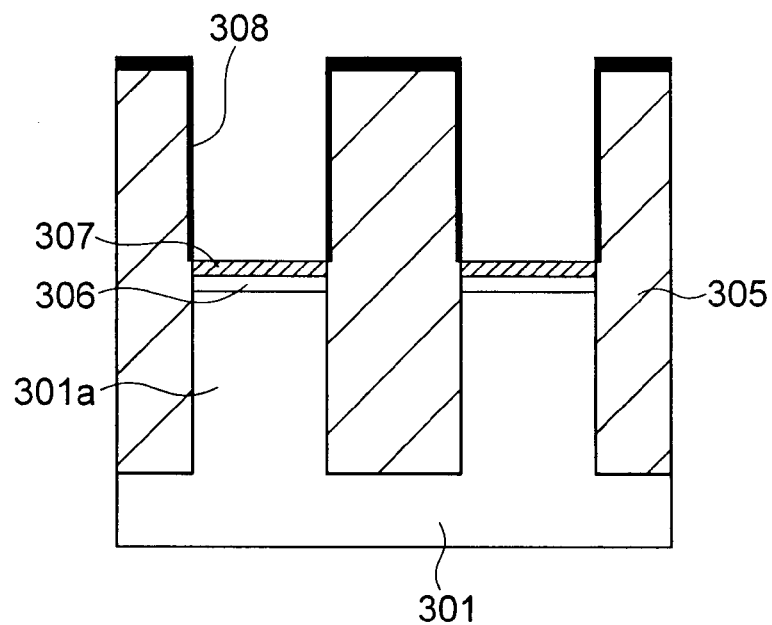

Next, as illustrated in FIG. 31, the silicon nitride film 302 is selectively etched, making parts of the surface of the semiconductor substrate 301 be exposed.

A tunnel oxide film 306 having a thickness of 10 nm is formed on the surface of the exposed surface of the semiconductor substrate 301 by thermal oxidation. Furthermore, using anisotropic nitridation, nitriding ions are generated by microwaves, radio-frequency waves or electron cyclotron resonance, and a radio-frequency wave voltage of, for example, 10 to 100 V is applied to the semiconductor substrate 301. The nitriding ions are accelerated toward the semiconductor substrate 301 and substantially perpendicularly enter the semiconductor substrate 301. Consequently, nitridation of the sidewall parts of the silicon oxide film 305 is suppressed, making the thickness of the silicon nitride film 308 on these parts be small, and the tunnel oxide film 306 is selectively nitrided, making the thickness of the silicon nitride film 307 on these parts be large. As described above, the surface of the tunnel oxide film 306 is nitrided to form a silicon nitride film (or silicon oxynitride film) 307.

In this embodiment, though the tunnel oxide film 306 is formed on the surface of the exposed semiconductor substrate 301 by thermal oxidation and then anisotropic nitridation is performed, such sequence may be reversed, i.e., thermal oxidation may be performed after performing anisotropic nitridation. Furthermore, thermal annealing may be performed after performing anisotropic nitridation. Alternatively, the thermal oxidation may be omitted.

Figure 32:
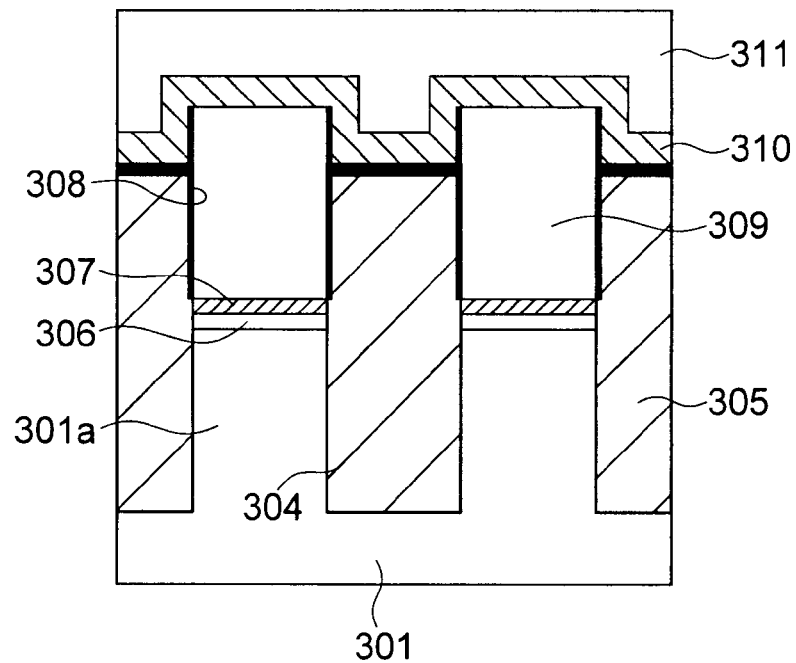
Figure 33:
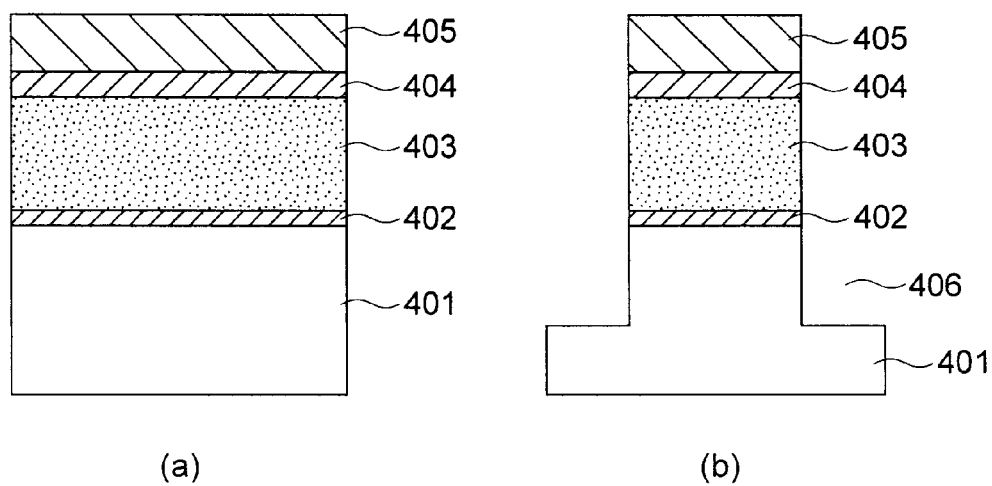
FIGS. 33 to 37 are longitudinal cross sectional views showing a method of manufacturing a semiconductor device according to a seventh embodiment.

In the subsequent process, as illustrated in FIG. 32, a polysilicon film 309, which serves as floating gate electrodes, is formed, and an inter electrode insulating film 310 and control gate electrodes 311 are formed to complete a memory cell structure.

According to the sixth embodiment, as a result of using anisotropic nitridation, nitridation of the silicon oxide film 305 on the sidewall parts can be suppressed, enabling suppression of interference between adjacent cells due to a parasitic capacitance in the word-line direction (channel width direction). In particular, where the thickness of the silicon nitride film 308 on the sidewalls, which is illustrated in FIG. 31, is large, adjacent cells become closer to each other, causing a phenomenon in which they interfere with each other because of a silicon nitride film having a high permittivity. However, such phenomenon can be suppressed.

Also, since the surface of the tunnel insulating film 306 is sufficiently nitrided by the anisotropic nitridation, this enables the reliability of the tunnel insulating film to be enhanced.

(13) Seventh Embodiment

A method of manufacturing a semiconductor device according to a seventh embodiment of the present invention will be described. The seventh embodiment corresponds to an example of applying the present invention to a nonvolatile memory in which control electrodes includes a metal layer or a metal compound layer, and an inter electrode insulating film includes a high-permittivity metal oxide film. In this specification, a material having a high-permittivity means such a material that has a relative permittivity of 7 or higher. This means that the permittivity of the material is approximately equal to or higher than that of silicon nitride.

Here, FIGS. 33(a), 34(a), 35(a), 36(a), 37(a) correspond to cross-sectional views in the bit-line (channel-length) and FIGS. 33(b), 34(b), 35(b), 36(b) and 37(b) correspond to cross-sectional views in the word-line (channel-width) direction.

A tunnel insulating film 402 with a thickness of 10 nm is formed on the surface of a semiconductor substrate 401 doped with a desired impurity, by thermal oxidation. A polysilicon layer 403 with a thickness of 150 nm, the polysilicon layer 403 being doped with phosphorus and serving as floating gate electrodes, a stopper film 404 used for CMP, and a mask film 405 used for RIE are deposited on the tunnel insulating film 402 by reduced-pressure CVD.

By means of RIE, the mask film 405, the stopper film 404, the polysilicon layer 403 and the tunnel insulating film 402 are sequentially etched. The exposed regions of the semiconductor substrate 401 are etched to form isolation trenches 406 with a depth of 150 nm.

Figure 34:
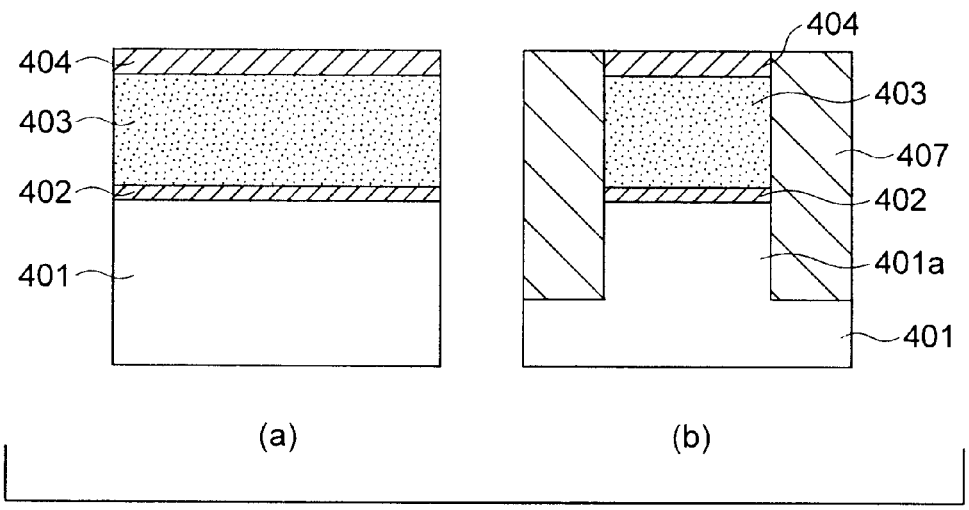

Next, as illustrated in FIGS. 34(a) and 34(b), a silicon oxide film 407 with a thickness of 400 nm, which is an insulating film for isolation, is deposited on the entire surface by plasma CVD to fill the isolation trenches 406 with the silicon oxide film 407. The silicon oxide film 407 and the mask film 405 are removed by CMP to planarize the surface. Here, the surface of the stopper film 404 is exposed.

Figure 35:
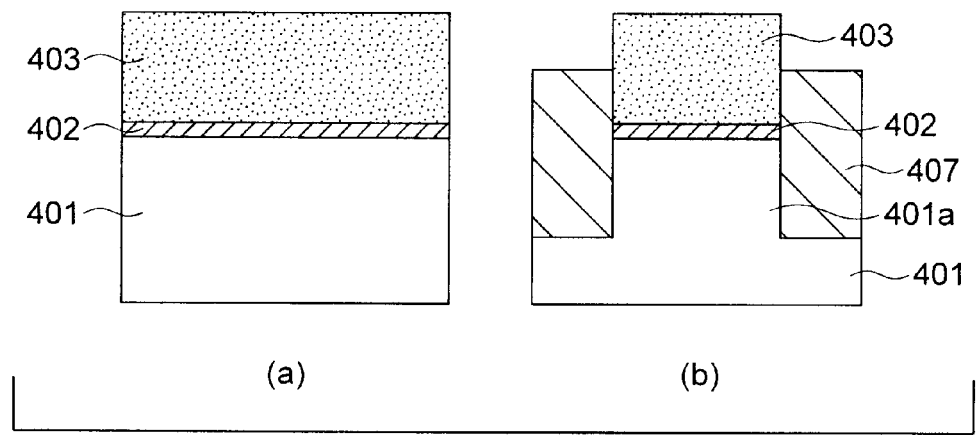

Next, as illustrated in FIGS. 35(a) and 35(b), the exposed stopper film 404 is selectively etched, and then the exposed surface of the silicon oxide film 407 is removed by etching using a diluted hydrofluoric acid solution to make the sidewall surfaces of the polysilicon layer 403 be exposed. It is assumed that the height of the sidewalls is 70 nm. By immersing the substrate in a diluted hydrofluoric acid, a natural oxide film (not shown) on the surface of the polysilicon layer 403 is removed.

Figure 36:
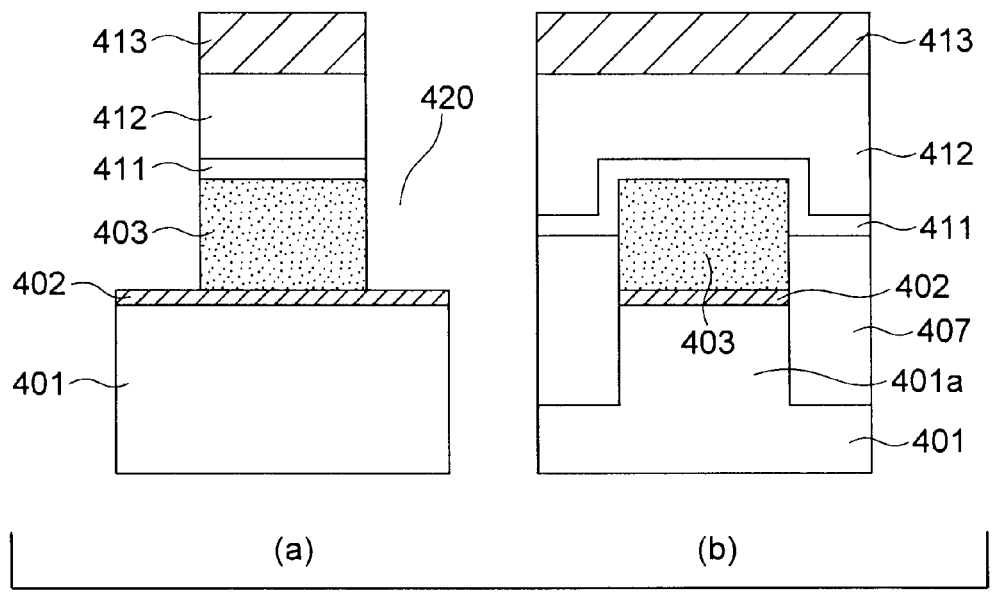

Next, as illustrated in FIGS. 36(a) and 36(b), a hafnia film is deposited in a deposition reactor as an inter electrode insulating film 411. Although in the seventh embodiment, a hafnia film is used for the inter electrode insulating film 411, a high-permittivity metal oxide film with a relative permittivity of 7 or more, such as $Al_2O_3$, $ZrO_2$, $LaO_2$, HfSiO, ZrSiO, HfAlO, ZrAlO or LaAlO, for example, may be formed.

A conductive layer 412 with a thickness of 100 nm, the conductive layer 412 being having a two-layer structure of metal compounds consisting of a polysilicon layer and a tungsten silicide layer and becoming control gate electrodes, is formed by sequentially depositing the polysilicon layer and the tungsten silicide layer by reduced-pressure CVD, and a mask film 413 for RIE is further deposited by reduced-pressure CVD.

In the seventh embodiment, the conductive layer 412, which become control gate electrodes, have a two-layer structure consisting of a polysilicon layer and a tungsten silicide layer. However, it may have a single-layer structure of, e.g., cobalt silicide (CoSi), nickel silicide (NiSi), tantalum nitride (TaN), titanium nitride (TiN), tungsten nitride (WN), tantalum silicon nitride (TaSiN) or titanium silicon nitride (TiSiN) or a laminate structure consisting of any combination thereof.

Subsequently, by means of RIE using a resist mask (not shown), the mask film 413, the conductive layer 412, the inter electrode insulating film 411 and the polysilicon layer 403 are sequentially etched to form slit parts 420 between the stacked cells. The tunnel insulating film 402 is an example of a first film to be processed in the present invention, and a film including the polysilicon layer 403, the inter electrode insulating film 411, and the conductive layer 412 is an example of a second film to be processed in the present invention.

Figure 37:
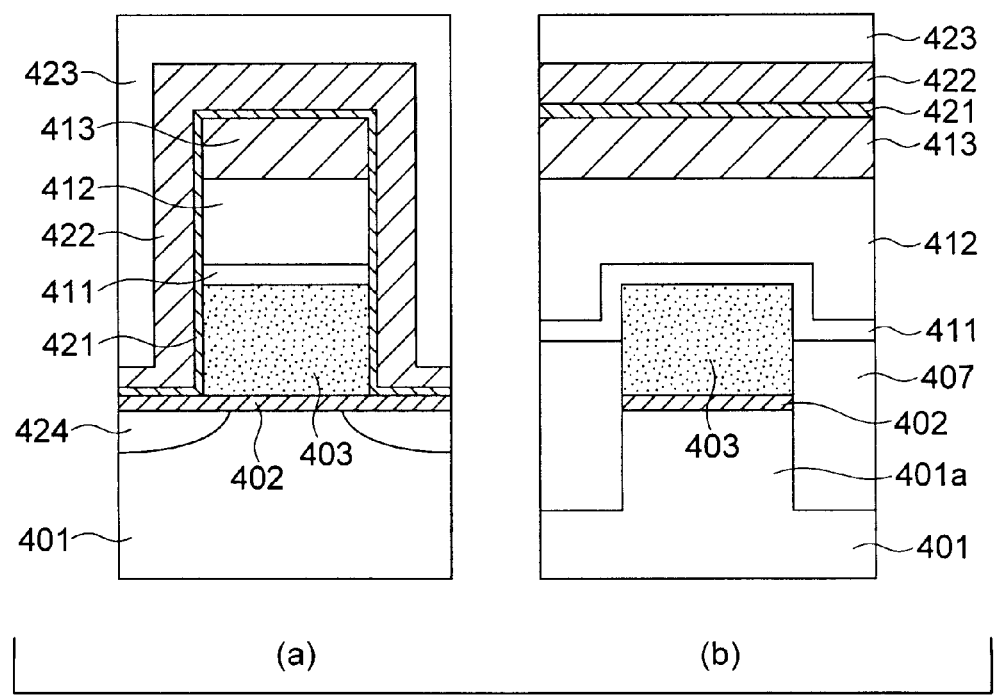

Next, as illustrated in FIGS. 37(a) and 37(b), using anisotropic oxidation, oxidizing ions are generated from a gas mixture of oxygen and hydrogen by microwaves, radio-frequency waves or electron cyclotron resonance, and a radio-frequency wave voltage of, for example, 10 to 100 V is applied to the semiconductor substrate. Consequently, the oxidizing ions are accelerated toward the semiconductor substrate, and substantially perpendicularly enter the semiconductor substrate, forming a silicon oxide film 421 with a thickness of around 5 nm, which is called as an electrode sidewall oxide film, on the exposed surface. Here, oxidation of the sidewall parts of the polysilicon layer 413 as the floating gate electrodes, and the sidewall parts of the conductive layer 412 as the control gate electrodes is suppressed, enabling selective oxidation of the exposed tunnel insulating film 402. Here, although FIG. 37 illustrates the case where the upper regions of the tunnel insulating film 402 are oxidized, the surface parts of the silicon substrate 1 of the slit parts may be also oxidized, by performing the anisotropic oxidation longer or at higher temperature, or changing the material of the tunnel insulating film to such a material that is easily oxidized. In this case, since the distance between the lower end of each floating gate electrode 403 and the surface of the silicon substrate 401 can be increased, the electric field is reduced, enabling the reliability of the memory cells to be further enhanced. Although in FIG. 37, the silicon oxide film 421 is formed also on the sidewall parts of the inter electrode insulating film 411, the sidewall parts of the mask film 413 and the upper surface part of the mask film 413, it may not be formed on them depending on their materials.

Here, as a result of performing anisotropic oxidation using a gas mixture of hydrogen and oxygen, oxidation of the conductive layer 412 formed of a metal compound, which serves as control gate electrodes, is suppressed, enabling erroneous memory operation due to an increase in the resistance of the control gate electrodes to be avoided. Also, where the inter electrode insulating film 411 is formed of high-permittivity metal oxide as in this embodiment, reduction by means of hydrogen, which results in deterioration of the insulation property, can be suppressed. Accordingly, the reliability of the tunnel insulating film 402 can be improved while suppressing an increase in the electrode resistance and deterioration of the inter electrode insulating film.

Here, although anisotropic oxidation is performed using a gas mixture of hydrogen and oxygen, anisotropic oxidation may be performed using an oxygen gas not containing hydrogen.

In the subsequent process, a cell diffusion layer 424 is formed using ion implantation. Furthermore, a silicon oxynitride film 422 and a silicon oxide film 423, which serve as an inter layer dielectric, are formed by reduced-pressure CVD so as to cover the entire surface, thereby completing nonvolatile memory cells.

According to the seventh embodiment, even where the inter electrode insulating film has a reducing property due to hydrogen, the reliability of the tunnel insulating film can be enhanced while suppressing insulation property deterioration due to reduction caused by the inter electrode insulating film.

(14) Eighth Embodiment

A method of manufacturing a semiconductor device according to an eighth embodiment of the present invention will be described. The eighth embodiment corresponds to an example of applying the present invention to a nonvolatile memory. It is assumed that: FIGS. 38(a), 39(a), 40(a), 41(a), 42(a) and 43(a) are cross-sectional views in the word-line (channel-width) direction; and FIGS. 38(b), 39(b), 40(b), 41(b), 42(b) and 43(b) correspond to cross-sectional views in the bit-line direction (channel-length).

Figure 38:
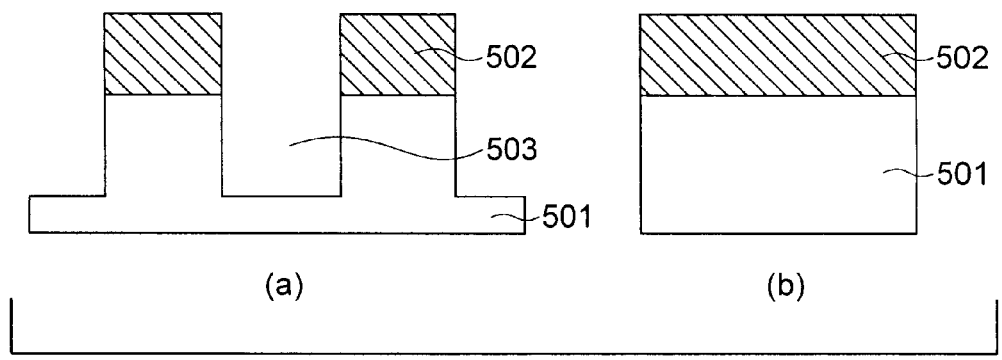
FIGS. 38 to 43 are longitudinal cross sectional views showing a method of manufacturing a semiconductor device according to an eighth embodiment.

First, as illustrated in FIGS. 38(a) and 38(b), a mask material 502 for isolation process is deposited on the surface of a semiconductor substrate 501 doped with a desired impurity, by means of CVD. By means of RIE using a resist mask (not shown), the mask material 502 is etched, and the exposed regions of the semiconductor substrate 501 are etched, forming isolation trenches 503 with a depth of 100 nm. It is assumed that the width of the isolation trenches 503 and the width of the element-forming regions are both approximately 40 nm.

Figure 39:
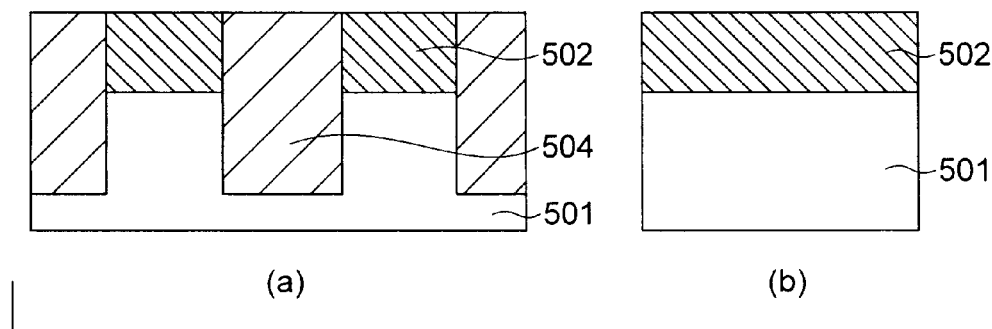

Next, as illustrated in FIGS. 39(a) and 39(b), a silicon oxide film 504 for isolation is deposited on the entire surface to completely fill the isolation trenches 503. Subsequently, the surface parts of the silicon oxide film 504 are removed by CMP to planarize the surface. Consequently, the surface of the mask material 502 is exposed.

Figure 40:
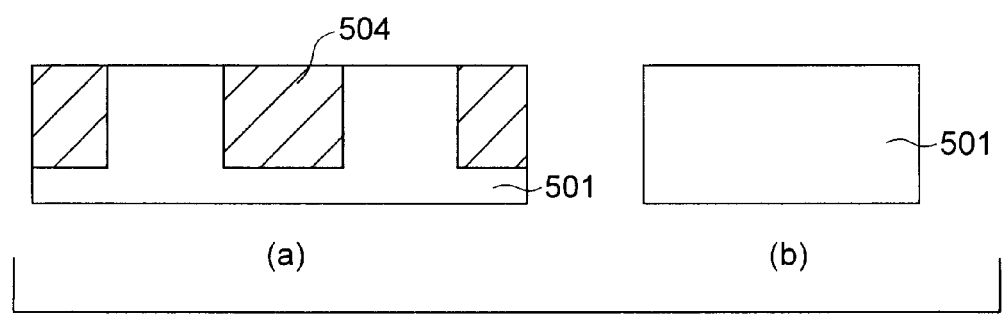

Next, as illustrated in FIGS. 40(a) and 40(b), the exposed mask material 502 is selectively removed by etching using, e.g., a chemical solution. Furthermore, the exposed surface of the silicon oxide film 504 is removed by etching using a diluted hydrofluoric acid solution to be at the same level as the semiconductor substrate 501.

Figure 41:
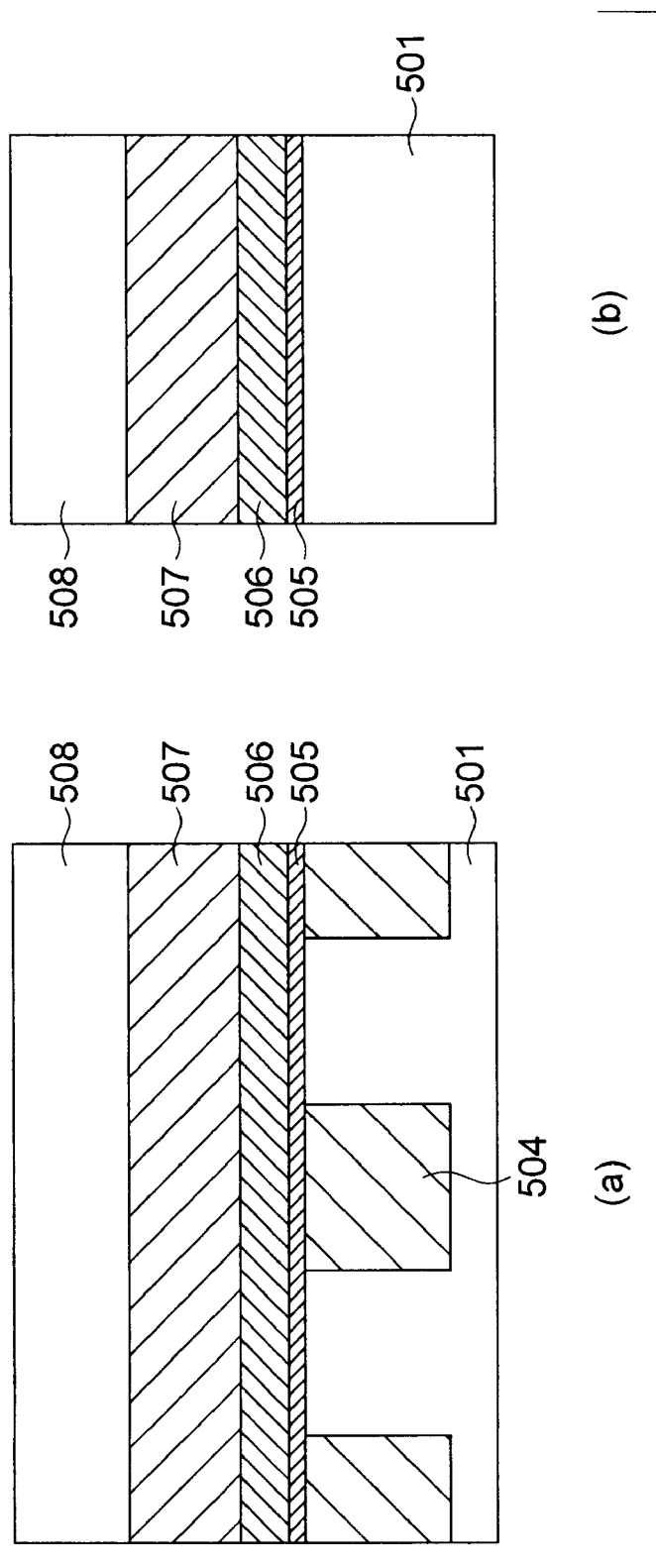

Next, as illustrated in FIGS. 41(a) and 41(b), a tunnel oxide film 505 with a thickness of 3 nm is formed by ALD (Atomic Layer Deposition). A silicon nitride film 506 with a thickness of 5 nm, which serves as a charge storage layer, is deposited by CVD, and an alumina film 507 with a thickness of 30 nm, which serves as a charge block layer, is deposited by ALD (Atomic Layer Deposition).

Furthermore, a conductive layer 508 with a thickness of 100 nm, the conductive layer 508 having a two-layer structure consisting of a polysilicon layer and a tungsten silicide layer, and becoming control gate electrodes, is deposited by CVD.

Figure 42:
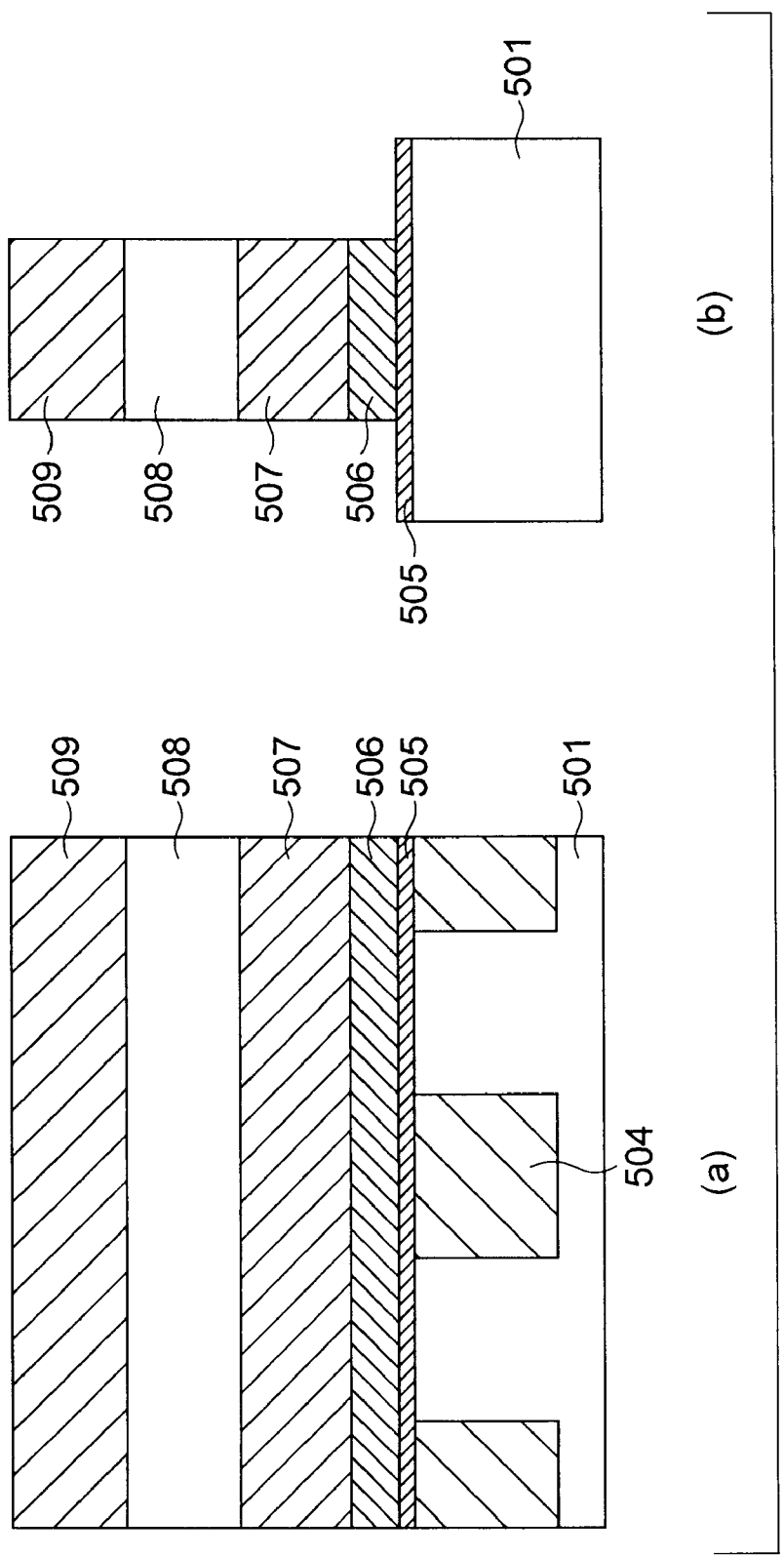

Next, as illustrated in FIGS. 42(a) and 42(b), a silicon nitride film 509, which serves as a mask material for RIE, is deposited by CVD. By means of RIE using a resist mask (not shown) having a pattern perpendicular to that of the isolation trenches 503, the mask material 509, the conductive layer 508 as control gate electrodes, the alumina film 507 as a charge block layer, and the silicon nitride film 506 as a charge storage layer are sequentially etched to form control gate electrodes. It is assumed that the width of the silicon nitride film 506 and the distance between adjacent parts of the silicon nitride film 506 are both approximately 40 nm. The tunnel oxide film 505 is an example of a first film to be processed in the present invention, and a film including the silicon nitride film 506, the alumina film 507, and the conductive layer 508 is an example of a second film to be processed in the present invention.

Here, the silicon nitride film 506 as a charge storage layer may be formed in the shape in which the width increases toward its lower part, i.e., what is called a skirt shape.

Figure 43:
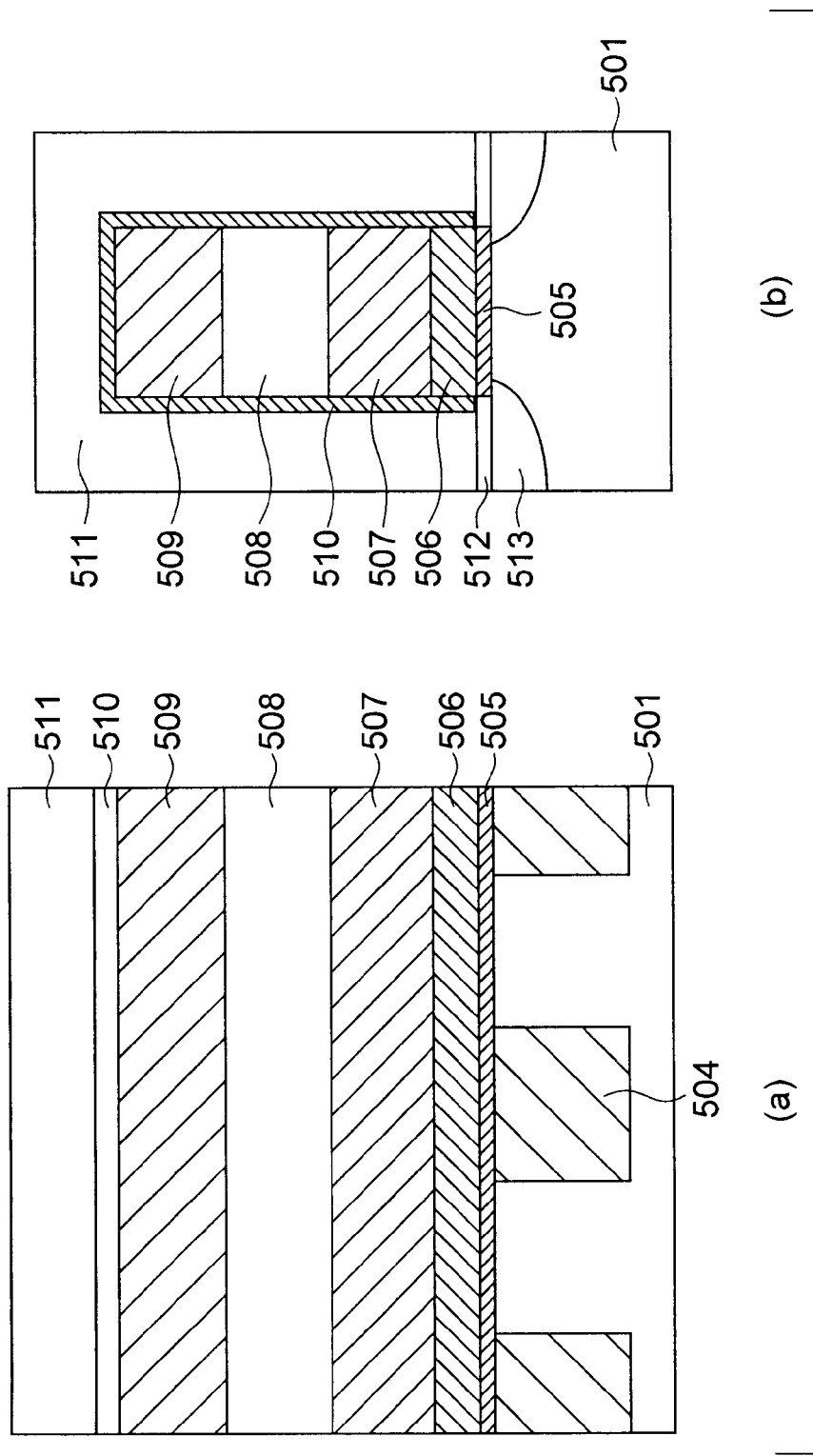

Next, as illustrated in FIGS. 43(a) and (b), using anisotropic oxidation, oxidizing ions are generated from a gas mixture by microwaves, radio-frequency waves or electron cyclotron resonance, and a radio-frequency wave voltage of, for example, 10 to 100 V is applied to the semiconductor substrate. Consequently, oxidizing ions are accelerated toward the semiconductor substrate 501 and substantially perpendicularly enter the semiconductor substrate 501, whereby oxidation of the sidewalls of the silicon nitride film 506 as a charge storage layer and the conductive layer 508 as control gate electrodes is suppressed, and the exposed tunnel insulating film 505 is selectively oxidized to subject the tunnel insulating film 505 to oxidation reforming, forming a reformed region 512. Here, although FIG. 43 illustrates the case where the exposed tunnel insulating film 505 is entirely changed into the reform region 512, only the surface parts of the tunnel insulating film 505 may be reformed, by performing the anisotropic oxidation shorter or at lower temperature, or changing the material of the tunnel insulating film to such a material that is not easily oxidized. Alternatively, an oxide layer may be formed on the surface parts of the silicon substrate 501 in the exposed regions of the tunnel insulating film.

Consequently, it is possible to suppress oxidation of the sidewall parts of the conductive layer 508 as control gate electrodes to avoid a decrease in the width of the control gate electrodes, and furthermore, to prevent the shapes of parts of an impurity diffusion layer from varying due to the oxide layer formed on the sidewall parts of the control gate electrodes. In addition, the exposed parts of the tunnel insulating film 505 are reformed by the oxidizing ions, which can improve the reliability of the tunnel insulating film 505.

Where the silicon nitride film 506 as a charge storage layer have a skirt shape, the bottom part of the film is selectively oxidized to have a large thickness, enabling suppression of erroneous cell operation and variation in cell operation characteristics.

In the subsequent process, a gate sidewall oxide film 510 with a thickness of 10 nm is formed by CVD. An impurity diffusion layer 513 is formed by performing ion implantation and thermal annealing. An inter later insulating film 511 is formed using, e.g., CVD, and furthermore, an interconnect layer, etc., (not shown) is formed to complete nonvolatile memory cells.

(15) Ninth Embodiment

A method of manufacturing a semiconductor device according to a ninth embodiment of the present invention will be described. The ninth embodiment corresponds to an example of applying the present invention to an apparatus in which an SOI-structure region is formed on a part of the semiconductor substrate to form a peripheral circuit region on the semiconductor substrate, and a memory cell region on the SOI-structure region of the same semiconductor substrate.

Figure 44:
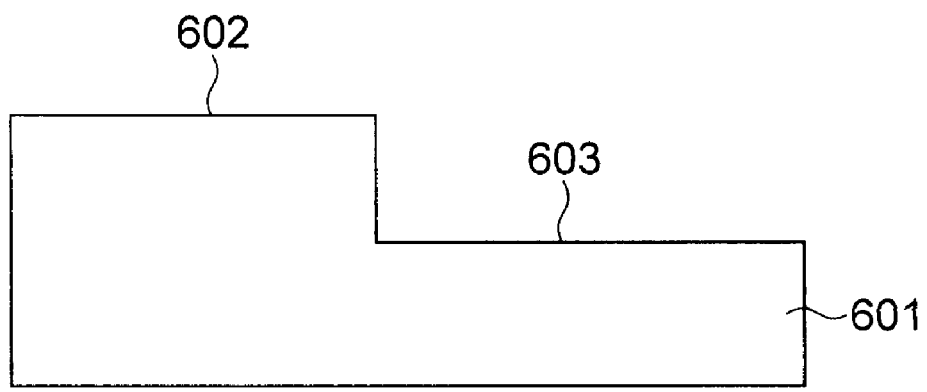
FIGS. 44 to 47 are longitudinal cross sectional views showing a method of manufacturing a semiconductor device according to a ninth embodiment.

As illustrated in FIG. 44, in order to provide a level difference between a peripheral circuit region 602 and a memory cell region 603, a mask material (not shown), which is formed of, e.g., a silicon nitride film, is deposited on a semiconductor substrate 601 by CVD.

By means of RIE using a resist mask (not shown), the mask material is etched to be partially exposed. Using this mask material, the exposed region of the semiconductor substrate 601 is removed by etching to form a peripheral circuit region 602, which is a planar part where a peripheral circuit is to be formed, and a memory cell region 603, which is a planar part where memory cells are to be formed, there being a level difference of 50 nm between the peripheral circuit region 602 and the memory cell region 603. As illustrated in FIG. 44, the level of the upper surface of the peripheral circuit region 602 is set to be higher than the level of the upper surface of the memory cell region 603. The planar part where a peripheral circuit is to be formed is an example of a first planar part of the present invention, and the planar part where memory cells are to be formed is an example of a second planar part of the present invention.

Figure 45:
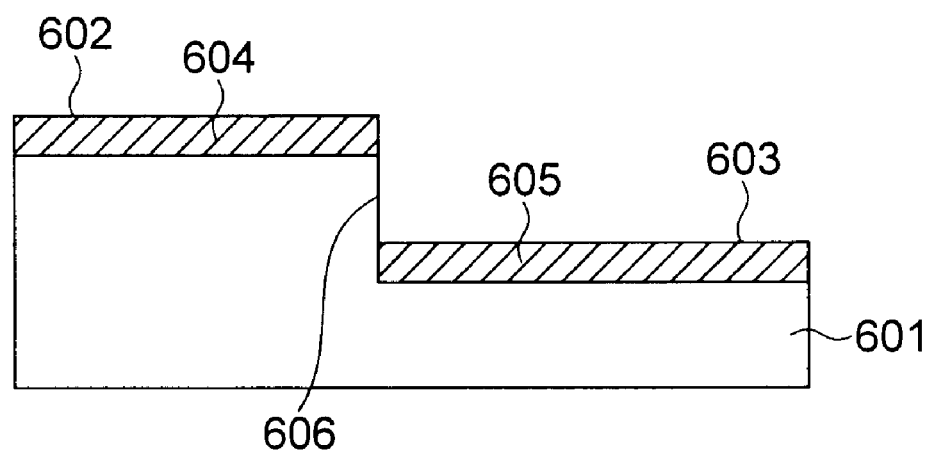

Using anisotropic oxidation, oxidizing ions are generated by microwaves, radio-frequency waves or electron cyclotron resonance, and a radio-frequency wave voltage of, for example, 10 to 100 V is applied to the semiconductor substrate 601. Consequently, the oxidizing ions are accelerated toward the semiconductor substrate 601 and substantially perpendicularly enter the semiconductor substrate 601. In FIG. 45, while suppressing oxidation of a sidewall part 606 of the stepped structure, the peripheral circuit region 602 and the memory cell region 603, which are planar parts, are selectively oxidized to form silicon oxide films 604 and 605 each having a thickness of 10 nm in the peripheral circuit region 602 and the memory cell region 603, respectively. The sidewall part 606 is an example of a step part according to the present invention, which is located at the boundary between the peripheral circuit region 602 and the memory cell region 603.

Although the silicon oxide films 604 and 605 are formed using anisotropic oxidation here, silicon nitride films may be formed similarly in the peripheral circuit region 602 and the memory cell region 603 using anisotropic nitridation.

Figure 46:
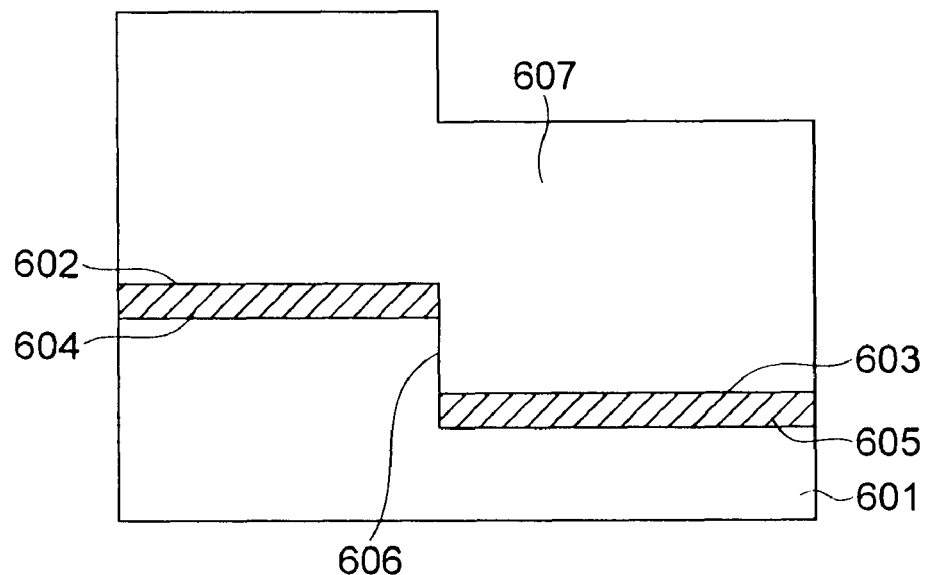

Subsequently, chemical etching using a diluted hydrofluoric acid solution or a hot phosphoric acid solution is performed to the extent that a sidewall oxide film formed on the sidewall part 606 of the stepped structure is removed. Furthermore, as illustrated in FIG. 46, an amorphous silicon film 607 having a thickness of 100 nm is deposited on the entire surface using reduced-pressure CVD. Annealing is performed to single-crystallize the amorphous silicon film 607. The amorphous layer 607 is an example of a semiconductor layer according to the present invention.

Figure 47:
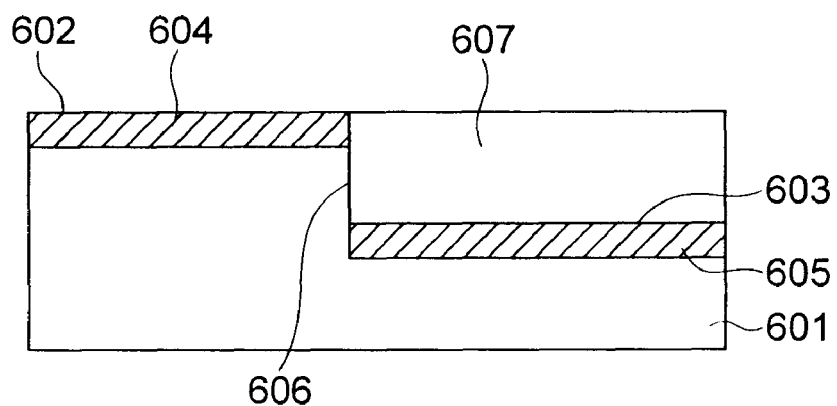

As illustrated in FIG. 47, the amorphous silicon film 607 is subjected to CMP to remove the amorphous silicon film 607 on the peripheral circuit region 602, and to remove a part of the amorphous silicon film 607 on the memory cell region 603, thereby planarizing the upper surface of the amorphous silicon film 607, and making the upper surface of the silicon oxide film 604 on the peripheral circuit region 602 be exposed. Consequently, the height of the upper surface of the amorphous silicon film 607 on the memory cell region 603 is lowered to the height of the upper surface of the silicon oxide film 604 on the peripheral circuit region 602. This makes the height of the upper surface of the amorphous silicon film 607 on the memory cell region 603 be substantially equal to the height of the upper surface of the silicon oxide film 604 on the peripheral circuit region 602. Through the subsequent process, memory cells are formed in the memory cell region 602 and peripheral circuits are formed in the peripheral circuit region 603 to complete a semiconductor device.

According to the ninth embodiment, a silicon oxide film formed on the sidewall part 606, which provides a level difference, is removed, and furthermore, oxidation or nitridation of the sidewall part 606 is suppressed when performing epitaxial growth on the semiconductor substrate 601, enabling suppressing displacement of the position of the step part due to forming and removing the silicon oxide film or the silicon nitride film on this part. Consequently, there is no fear of hindrance for forming circuits using the position of the sidewall part 606 as a reference.

All the above embodiments are mere examples, and various modifications can be made within the technical scope of the present invention. For example, anisotropic oxidation in the respective embodiments may be substituted with anisotropic nitridation, or anisotropic nitridation may be performed as a substitute for anisotropic oxidation.

Also, aspects of a method of manufacturing a semiconductor device according to the present invention include methods described below.

The aspects of the present invention include, for example, a method of manufacturing a semiconductor device comprising: forming a first film, which becomes a dummy gate film, on a semiconductor substrate; removing a predetermined region of the first film by etching to form a dummy gate film and make a surface of the semiconductor substrate be partially exposed; forming a first insulating film so as to cover the dummy gate film; performing etching of the first insulating film to form a sidewall insulating film, which includes the first insulating film, on a side surface of the dummy gate film; forming a second insulating film so as to cover the dummy gate film and the sidewall insulating film; planarizing a surface part of the second insulating film to make an upper part of the dummy gate film be exposed; removing the dummy gate film to form a slit part including sidewall parts including side surfaces of the sidewall insulating film and a bottom part including a surface of the semiconductor substrate; forming a third insulating film, which becomes a part of a gate insulation film, at least on a bottom surface of the slit part; applying a predetermined voltage to the semiconductor substrate to supply oxidizing ions contained in plasma generated by any of a microwave, a radio-frequency wave and electron cyclotron resonance or nitriding ions contained in the plasma to the sidewall parts of the slit part and the bottom part of the slit part, thereby performing anisotropic oxidation or anisotropic nitridation of the sidewall parts of the slit part and the bottom part of the slit part; and depositing a conductive material as a material for a gate electrode so as to fill the slit part.

Also, the aspects of the present invention include, for example, a method of manufacturing a semiconductor device comprising: forming a first film, which becomes a dummy gate film, on a semiconductor substrate; removing the first film and a part of the semiconductor substrate, the part having a predetermined depth, in a predetermined region by etching to form a dummy gate film and forming a plurality of isolation trenches along a first direction; filling the plurality of isolation trenches with a first insulating film; planarizing a surface part of the first insulating film to make an upper surface of the dummy gate film be exposed; removing the dummy gate film to form a slit part including sidewall parts including side surfaces of the first insulating film and a bottom part including a surface of the semiconductor substrate; forming a second insulating film, which becomes a part of a tunnel insulating film, at least on a bottom surface of the slit part; applying a predetermined voltage to the semiconductor substrate to supply oxidizing ions contained in plasma generated by any of a microwave, a radio-frequency wave and electron cyclotron resonance or nitriding ions contained in the plasma to the sidewall parts of the slit part and the bottom part of the slit part, thereby performing anisotropic oxidation or anisotropic nitridation of the sidewall parts of the slit part and the bottom part of the slit part, thereby forming a tunnel insulating film; forming a floating gate electrode on the tunnel insulating film; and sequentially forming an inter electrode insulating film and a control gate electrode on the floating gate electrode and the first insulating film.

As described above, the embodiments of a method of manufacturing a semiconductor device according to the present invention enable problems arising when performing isotropic oxidation or nitridation of the sidewall parts and bottom parts of the isolation trenches and/or the gate electrodes to be solved.

Although specific examples of aspects of the present invention have been described by the first to ninth embodiments, the present invention is not limited to these embodiments.

The invention claimed is:

1. A method of manufacturing a semiconductor device, the method comprising:
   forming a conductive film whose upper surface and side surface are exposed and an insulation film whose upper surface is exposed, on a semiconductor substrate; and
   supplying oxidizing ions or nitriding ions contained in plasma generated by a microwave, a radio-frequency wave, or electron cyclotron resonance to the exposed side surface of the conductive film and the exposed upper surface of the insulation film, by applying a predetermined voltage to the semiconductor substrate, thereby performing anisotropic oxidation or anisotropic nitridation of the exposed side surface of the conductive film and the exposed upper surface of the insulation film.

2. The method according to claim 1, wherein a temperature of the semiconductor substrate during the anisotropic oxidation or the anisotropic nitridation is equal to or higher than 300° C.

3. The method according to claim 1, wherein a pressure in a region where the plasma is generated is equal to or smaller than 2 kPa.

4. The method according to claim 1, wherein the oxidizing ions or the nitriding ions are supplied to the exposed upper and side surfaces of the conductive film and the exposed upper surface of the insulation film, thereby performing the anisotropic oxidation or the anisotropic nitridation of the exposed upper and side surfaces of the conductive film and the exposed upper surface of the insulation film.

* * * * *